(12) United States Patent
Kato et al.

(10) Patent No.: US 6,603,689 B2
(45) Date of Patent: Aug. 5, 2003

(54) SEMICONDUCTOR MEMORY DEVICE HAVING REDUNDANCY SYSTEM

(75) Inventors: Daisuke Kato, Kamakura (JP); Yohji Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/045,780

(22) Filed: Jan. 11, 2002

(65) Prior Publication Data

US 2002/0093860 A1 Jul. 18, 2002

(30) Foreign Application Priority Data

Jan. 12, 2001 (JP) ....................................... 2001-005562

(51) Int. Cl.[7] ............................................... G11C 7/00
(52) U.S. Cl. ..................................... 365/200; 365/225.7
(58) Field of Search ............................... 365/200, 225.7

(56) References Cited

U.S. PATENT DOCUMENTS

| 5,940,335 | A | * | 8/1999 | Kirihata | 365/200 |
|---|---|---|---|---|---|
| 5,991,211 | A | | 11/1999 | Kato et al. | 365/200 |
| 6,243,305 | B1 | * | 6/2001 | Brady | 365/200 |
| 6,388,941 | B2 | * | 5/2002 | Otori et al. | 365/225.7 |
| 6,400,620 | B1 | * | 6/2002 | Yoo | 365/225.7 |
| 6,430,101 | B1 | * | 8/2002 | Toda | 365/200 |
| 6,480,428 | B2 | * | 11/2002 | Zheng et al. | 365/200 |

* cited by examiner

*Primary Examiner*—Trong Phan
(74) *Attorney, Agent, or Firm*—Hogan & Hartson, LLP

(57) ABSTRACT

A semiconductor memory device having a memory system and a redundancy system including redundant elements for repairing a plurality of defects in the memory system, comprising a plurality of address fuse sets each including address fuses for programming a defective address in the memory system, and a master fuse for preventing a corresponding redundant element from being selected when the redundant element is not used, wherein at least one master fuse is shared by at least two fuse sets among the plurality of address fuse sets.

34 Claims, 12 Drawing Sheets

SEMICONDUCTOR MEMORY DEVICE HAVING REDUNDANCY SYSTEM

CROSS-REFERENCE TO RELATED APPLICATIONS

This application is based upon and claims the benefit of priority from the prior Japanese Patent Application No. 2001-005562, filed Jan. 12, 2001, the entire contents of which are incorporated herein by reference.

BACKGROUND OF THE INVENTION

1. Field of the Invention

The present invention relates to a semiconductor memory device, and more particularly, to a semiconductor memory device having a redundancy system.

2. Description of the Related Art

FIG. 15 is a block diagram schematically showing the arrangement of a redundancy system in a conventional semiconductor memory device. In FIG. 15, a fuse set 100 surrounded by a broken line is composed of a plurality of address fuses FUSE0 to FUSEn, which are disposed in correspondence to n+1 input address signals A0 to An supplied via address lines for programming a defective addresses of a memory array in the semiconductor memory device, and a master fuse FUSEM which is provided to prevent the redundant elements from being selected when they are not used.

The outputs from the plurality of address fuses FUSE0 to FUSEn and the output from the master fuse FUSEM are latched by a plurality of fuse latch circuits FLATCH0 TO FLATECHn and a fuse latch circuit FLATCHM disposed in correspondence to them, and then the outputs from the fuse latch circuits are supplied to corresponding address comparators ACOMP0 to ACOMPn each composed of an EX-NOR circuit together with the input address signals A0 to An.

Whether the latch outputs FOUT0 to FOUTn from the fuse latch circuits FLATCH0 to FLATCHn are set to "H" or "L" is determined according to the states of the address fuses FUSE0 to FUSEn, that is, based on whether or not the fuses are blown.

Then, as to each of the input address signals A0 to An, it is determined by any one of the address comparators whether the H- or L-level of a corresponding one of the input address signals agrees with the H- or L-level of a corresponding one of the latch outputs FOUT0 to FOUTn. Subsequently, when all the input address signals A0 to An agree with programmed addresses, that is, agree with the latch outputs FOUT0 to FOUTn as well as when the master fuse FUSEM is blown and a latch output FOUTM goes to "H", a NAND circuit HD acting as a hit detector outputs an L-signal bHIT indicating a redundancy mode.

Incidentally, the redundancy system disposed in the semiconductor memory device has a lot of fuses. Thus, it is very important to dispose an overall redundancy circuit including the fuses themselves as compact as possible in layout to reduce the size of the semiconductor memory device.

FIGS. 16A and 16B are views schematically showing a layout of a plurality of fuses. Fuses for redundancy are usually arranged along an address bus. However, it is impossible to arrange a lot of fuses in one stage of a fuse row that is, in one stage of a fuse bank 110 in unlimited quantities, and there is a case in which they must be accommodated within a width W of FIG. 16A. The width of the fuse bank 110 is restricted by layouts other than the layout of the redundancy system, and the like. However, if even only one necessary fuse (for example, fuse FUSEk+1) cannot be accommodated in the width W, the one stage of the fuse row 110 must be increased to two stages of fuse banks 112 and 113 as shown in FIG. 16B. An increase in the number of the stages to the two stages increases the area of the redundancy layout because the height of a redundancy layout is increased from H1 to H2. As a result, a chip area is also increased. That is, there is a case in which a slight difference of the number of fuses greatly changes the layout area of a redundancy circuit.

BRIEF SUMMARY OF THE INVENTION

A semiconductor memory device according to one aspect of the present invention having a memory system and a redundancy system including redundant elements for repairing a plurality of defects in the memory system, comprising: a plurality of address fuse sets each including address fuses for programming a defective address in the memory system; and a master fuse for preventing a corresponding redundant element from being selected when the redundant element is not used, wherein at least one master fuse is shared by at least two fuse sets among the plurality of address fuse sets.

DETAILED DESCRIPTION OF THE INVENTION

A plurality of embodiments of the present invention will be described below with reference to the drawings.

The inventors conceived to share a defective element designation fuse such as an address fuse or the like, which designates a defective element to be substituted, by a plurality of fuse sets as a countermeasure for avoiding a great increase in a layout area which is caused by a slight increase in the number of fuses as described above.

That is, the number of entire fuses can be reduced by sharing the defective element designation fuse by the plurality of fuse sets.

Figure 1:
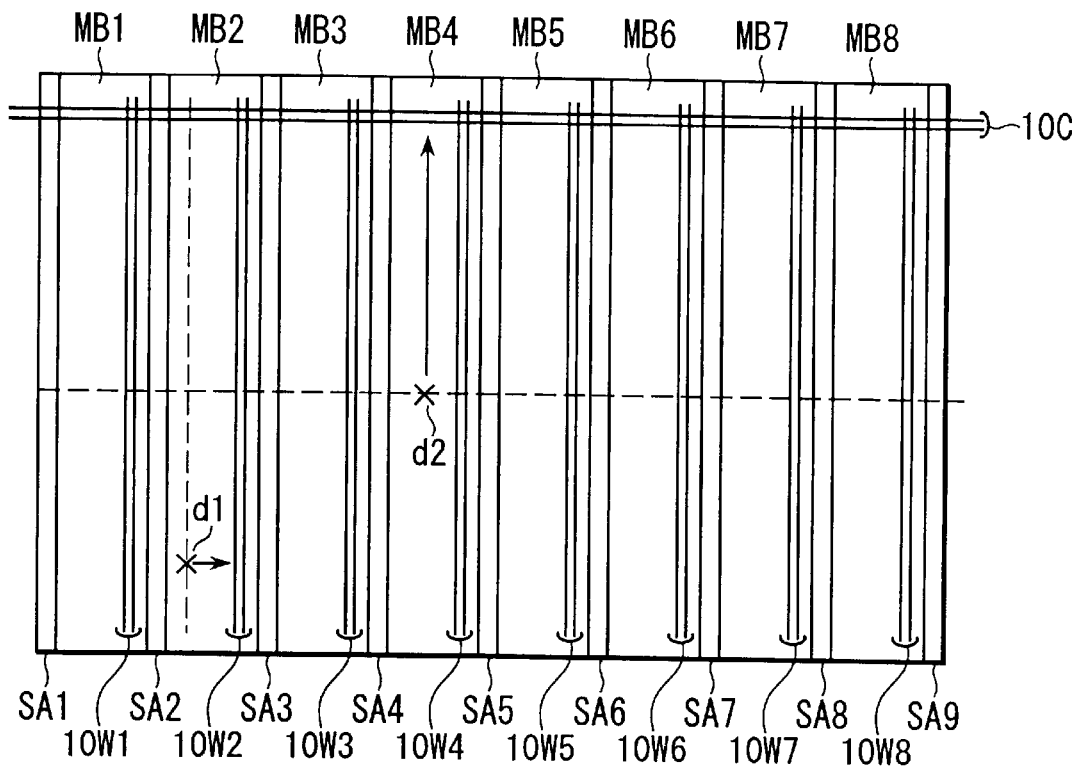
FIG. 1 is a plan view schematically showing the arrangement of a semiconductor memory device having a redundancy system relating to one embodiment of the present invention.

FIG. 1 is a plan view showing the arrangement of a semiconductor memory device having a redundancy system relating to the present invention. The semiconductor memory device is arranged such that eight memory blocks MB1 to MB8, for example, are disposed in a row direction with sense amplifiers SA1 to SA8 interposed, respectively. A plurality of column select lines (csl, not shown) and a plurality of word lines (not shown) are formed for each of the memory blocks MB1 to MB8 integrally therewith. Further, spare column selection lines (spare CSLS) 10c are formed commonly to the respective memory blocks MB1 to MB8, and spare word lines (spare WLs) 10W1 to 10W8 are formed to the respective memory blocks MB1 to MB8.

It is assumed, for example, that a memory cell d1 in the memory block MB2 and a memory cell d2 in the memory block MB4 are defective. To repair the defective memory cell d1 in the memory block MB2, it is possible to use a spare word line 10W2 or a spare column selection line 10c.

Likewise, to repair the defective cell d2 in the memory block MB4, it is possible to use a spare word line 10W4 or a spare column selection line 10c.

Further, in order to increase the repair efficiency for the column redundancy, it is possible to utilize a column redundancy system provided with a spare CSL divided by row addresses into a plurality of redundant elements.

Figure 2:
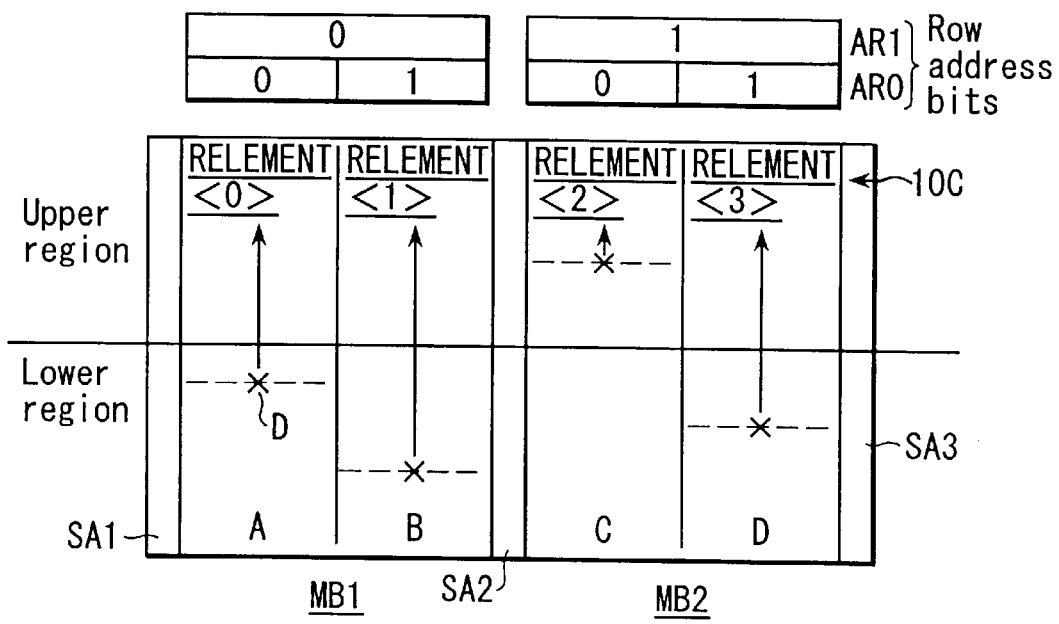
FIG. 2 is a view showing the arrangement of a column redundancy system arranged to use one spare CSL as a plurality of redundant elements by dividing it by row addresses.

This will be described with reference to, for example, FIG. 2. FIG. 2 is a view showing two adjacent memory blocks MB1 and MB2 extracted from a memory array composed of a multiplicity of memory blocks. In FIG. 2, a sense amplifier SA2 is shared by bit line pairs in the two adjacent memory blocks MB1 and MB2, and the overall memory array is divided into four regions A, B, C, and D determined by, for example, two-bit row address AR0 and AR1.

FIG. 2 is a view showing a column redundancy system in which one spare CSL is divided by row addresses and used as a plurality of redundant elements. In FIG. 2, however, spare word lines in a row direction are omitted to avoid the complication of the figure.

The relationship between redundant elements and corresponding repair regions will be described with reference to a system arranged as described below as an example. The system is arranged such that each spare CSL is divided by input row addresses and used as a plurality of column redundant elements in a column redundancy system in which a defective CSL is inactivated and a spare CSL is activated and substituted for the defective CSL.

The column redundancy system is arranged such that when a column address corresponding to a defective cell in a memory array is input in a state that a row corresponding to an input address in the memory array is accessed (in a state that a certain word line is activated), a spare cell for redundancy on the row is accessed (a spare CSL is activated and data is read from and written to the spare cell) in place of that a cell, which corresponds to the column address, is accessed on the same row (a normal CSL is activated and data is read from and written to a cell of a column address which is the same as that of the defective cell).

Generally, in the column redundancy system, a spare cell is not substituted for each cell, but a plurality of cells in a spare column are substituted for a plurality of cells including a defective cell in the same column. A group of spare cells as a unit of substitution is called a redundant element. Then, the column redundant element includes cells corresponding to a plurality of rows.

When a word line is activated and thus a CSL is activated, a cell, which is designated by the activated word line and the activated CSL, is accessed whether the CSL is a normal CSL or a spare CSL. Here, a case will be examined in which a plurality of word lines are activated together, one of the word lines includes a defect, and the defect is relieved by the column redundancy. When a column address corresponding to the defect is input, a spare CSL is activated in place of a normal CSL corresponding to the column address, and then a spare cell is accessed, the cells, which correspond to the input column address in the other word lines that include no defect, are also not accessed, and the spare cells corresponding to the spare CSL are accessed.

As described above, when the cells on the word lines that are activated together are substituted for the column redundancy, these cells are substituted all together inevitably. Accordingly, the spare cells, which correspond (belong) to the rows (word lines) that are activated together and simultaneously accessed, belong to the identical column redundant element. Conversely, the spare cells, which correspond (belong) to the rows (word lines) that are not activated together need not belong to the same identical redundant element.

When it is assumed in FIG. 2 that a row address is input and only one word line is activated within the two memory block, the activated word line is located in any one of the regions A, B, C, and D.

Since the spare cells, which correspond (belong) to the rows (word lines) which are not accessed simultaneously need not belong to the same redundant element as described above, it is possible to allocate the spare cells on the spare CSL (column selection line) 10 into the four regions A, B, C, and D by the two-bit row addresses AR0 and AR1 and to arrange each group of spare cells as a column redundant element.

With this arrangement, one spare CSL is composed of four redundant elements RELEMENT<0> to RELE- MENT<3> that are determined by the row addresses AR0 and AR1. Accordingly, since it is possible in the column redundancy to increase the number of redundant elements without increasing the number of spare cells (without increasing the number of spare CSLs), a redundancy system having an increased or good area efficiency can be arranged.

When a fuse set corresponds to each of the redundant elements RELEMENT<0> to RELEMENT<3>, it is possible to program the respective redundant elements RELEMENT<0> to RELEMENT<3> so as to substitute a different column address. When it is possible to program any address of all the CSLs of the memory array to each fuse set, the redundant elements RELEMENT<0> to RELEMENT<3> can be substituted for all the defective cells in the regions A, B, C, and D, respectively.

A region, in which the redundant elements that can be programmed by the fuse sets can be substituted for any element in the region, is called a repair region to the corresponding fuse set. A particular fuse set need not always fixedly correspond to a particular redundant element. The repair regions corresponding to the fuse sets of the respective redundant elements RELEMENT<0> to RELEMENT<3> are the regions A, B, C, and D.

Further, since the spare cells, which correspond to the rows (word lines) from and to which data is simultaneously read and written, belong to the same redundant element as described above, the rows (word lines) which are activated together and from and to which data is simultaneously read and written must be located in the same repair region.

In FIG. 2, each of the repair regions A to D is further divided into an upper region and a lower region, and each fuse set has a fuse for designating whether an upper side element is to be substituted or a lower side element is to be substituted in the repair regions A to D.

It is assumed that the fuse for designating the upper and lower side elements is shared by the fuse set corresponding to the redundant element RELEMENT<0> and by the fuse set corresponding to the redundant element RELEMENT<2>.

Thus, as shown in FIG. 2, when the redundant element RELEMENT<0> is programmed so as to be substituted for an upper side defective element, the redundant element RELEMENT<2> is automatically substituted for the upper side defective element (if it is used for the substitution).

That is, in the method of sharing a fuse such as the address fuse or the like for designating a defective element to be substituted, the fuse set, which corresponds to the redundant element RELEMENT<2> which could be programmed so as to be substituted for any defective element in the upper and lower regions if the designating fuse was not shared, is substituted for only a defective element in either of the upper and lower regions depending upon a programmed state of the redundant element RELEMENT<0> because the designating fuse is shared.

From a different point of view, the repair region to the fuse set of the redundant element RELEMENT<2> is decreased in half in area. That is, a problem that a redundancy efficiency is reduced occurs in the method of sharing the fuse such as the address fuse or the like for designating a defective element to be substituted.

To cope with the above problem, the inventors further invented a semiconductor memory device having a redundancy system that can solve even this problem, does not increase the area of a redundancy layout and has a high redundancy efficiency.

The respective embodiments of the present invention will be sequentially described below in detail with reference to the drawings.

(1) First Embodiment

A first embodiment of the present invention is arranged such that a master fuse FUSEM, which prevents the selection of redundant elements when they are not used, is shared by a plurality of fuse sets.

Figure 3:
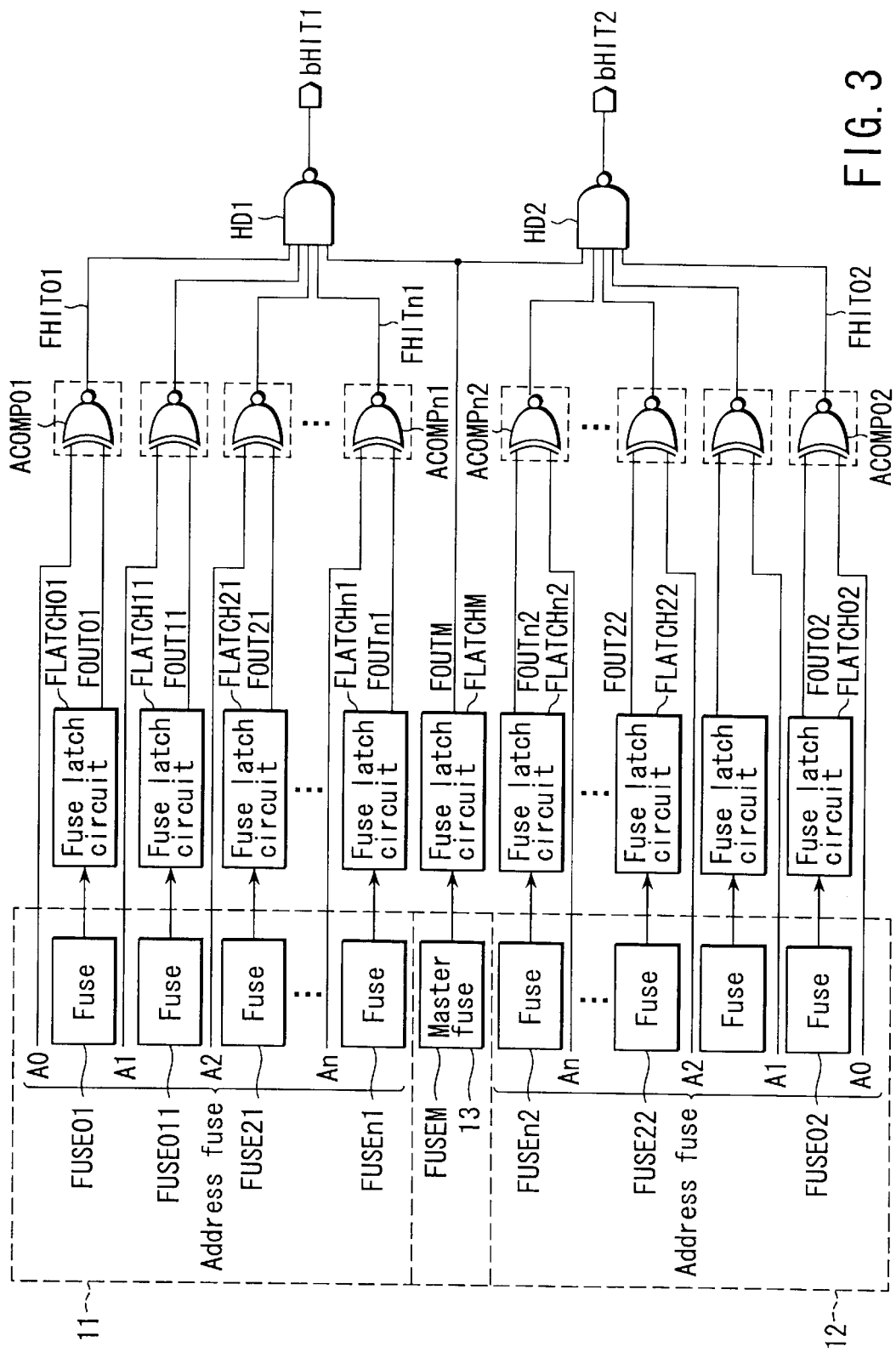
FIG. 3 is a block diagram showing a circuit arrangement of a first embodiment of the present invention.

FIG. 3 is a block diagram showing the circuit arrangement of a redundancy system of the first embodiment, wherein two fuse sets 11 and 12 share the single master fuse FUSEM.

One of the fuse sets 11 and 12, that is, the fuse set 11 is composed of a plurality of address fuses FUSE01 to FUSEn1 and the master fuse FUSEM. The plurality of address fuses FUSE01 to FUSEn1 are disposed in correspondence to n+1 pieces of input address signals A0 to An for programming a defective address in a memory array in a semiconductor memory device. The master fuse FUSEM prevents the selection of a redundant element when it is not used.

The outputs from the plurality of address fuses FUSE01 to FUSEn1 are latched by a plurality of corresponding fuse latch circuits FLATCH01 to FLATCHn1, and then supplied to corresponding address comparators ACOMP01 to ACOMPn1 each composed of an EX-NOR circuit together with the input address signals A0 to An.

Whether the latch outputs FOUT01 to FOUTn1 from the fuse latch circuits FLATCH01 to FLATCHn1 are set to "H" or "L" is determined based on the states of the address fuses FUSE01 to FUSEn1, that is, based on whether or not the fuses are blown.

Then, as to each of the input address signals A0 to An, it is determined by any one of the address comparators ACOMP01 to ACOMPn1 whether the H- or L-level of a corresponding one of the input address signals agrees with the H- or L-level of a corresponding one of the latch outputs FOUT01 to FOUTn1. Subsequently, when all the input address signals A0 to An agree with programmed addresses, that is, agree with the latch outputs FOUT01 to FOUTn1 as well as when the master fuse FUSEM is blown and a latch output FOUTM goes to "H", a NAND circuit acting as a hit detector HD1 outputs an L-signal bHIT1 indicating a redundancy mode.

The other fuse set 12 is composed of a plurality of address fuses FUSE02 to FUSEn2 and the master fuse FUSEM. The plurality of address fuses FUSE02 to FUSEn2 are disposed in correspondence to the n+1 pieces of the input address signals A0 to An for programming a defective address in the memory array in the semiconductor memory device in the same way. The master fuse FUSEM prevents the selection of a redundant element when it is not used. The master fuse FUSEM is shared by the other fuse set 11.

The outputs from the plurality of address fuses FUSE02 to FUSEn2 are latched by a plurality of corresponding fuse latch circuits FLATCH02 to FLATCHn2, and then supplied to corresponding address comparators ACOMP02 to ACOMPn2 each composed of an EX-NOR circuit together with the input address signals A0 to An.

Whether the latch outputs FOUT02 to FOUTn2 of the fuse latch circuits FLATCH02 to FLATCHn2 are set to "H" or "L" is determined based on the states of the address fuses FUSE02 to FUSEn2, that is, based on whether or not the fuses are blown.

Then, as to each of the input address signals A0 to An, it is determined by any one of the address comparators ACOMP02 to ACOMPn2 whether the H- or L-level of a corresponding one of the input address signals agrees with the H- or L-level of a corresponding one of the latch outputs FOUT02 to FOUTn2. Subsequently, when all the input address signals A0 to An agree with programmed addresses, that is, agree with the latch outputs FOUT02 to FOUTn2 as well as when the master fuse FUSEM is blown and the latch output FOUTM goes to "H", a NAND circuit acting as a hit detector HD2 outputs an L-signal bHIT2 indicating a redundancy mode.

For example, a redundancy system circuit having the arrangement of the embodiment shown in FIG. 3 can be applied to the column redundancy system of FIG. 2. In the arrangement of FIG. 2, the one fuse set 11 is used in correspondence to the redundant element RELEMENT<0>, the other fuse set 12 is used in correspondence to the redundant element RELEMENT<2>, and the master fuse FUSEM is shared by both the fuse sets 11 and 12.

With this arrangement, even if the redundant element RELEMENT<0> is used for substitution of a defective memory cell, the redundant element RELEMENT<2> remains to substitute for any defective element in the upper and lower regions, and thereby the repair regions for the fuse sets are unchanged and a redundancy efficiency does not decrease.

In this method, when the one redundant element RELEMENT<0> is used for substitution, the other redundant element RELEMENT<2> is also automatically used for substitution. Thus, if the redundant element RELEMENT<2> is defective, a problem is arisen thereby. That is, when a certain redundant element is used for repair, it is required that not only the redundant element but also other redundant element that shares the master fuse FUSEM is defect free.

Actually, even if a column redundant element is defective, it can be repaired by a row redundant element. However, design should not be made taking this point into consideration from the beginning. This is also applied to the following embodiments similarly.

While it is supposed that this kinds of restrictions and the requirements for the redundant element decrease the redundancy efficiency. It is conceived, however, that the redundancy efficiency is not very decreased by sharing the master fuse because of the reasons described below:

1. Since the ratio of the redundant elements to all the memory elements is small, a probability that only the redundant elements are remarkably made defective is low; and 2. Since a certain repair region usually has a plurality of redundant elements, all the redundant elements are not always used up.

Actually, a decrease in the redundancy efficiency can be suppressed by testing the redundant elements before they are substituted and by not using defective redundant elements as far as possible.

The arrangement and the operation of the fuse latch circuits used in the redundancy system of the embodiment shown in FIG. 3 will be described with reference to FIGS. 4A and 4B. While FIGS. 4A and 4B describe the fuse lath circuit FLATCH01 of FIG. 3 as an example, the other circuits are also arranged similarly.

Figure 4A:
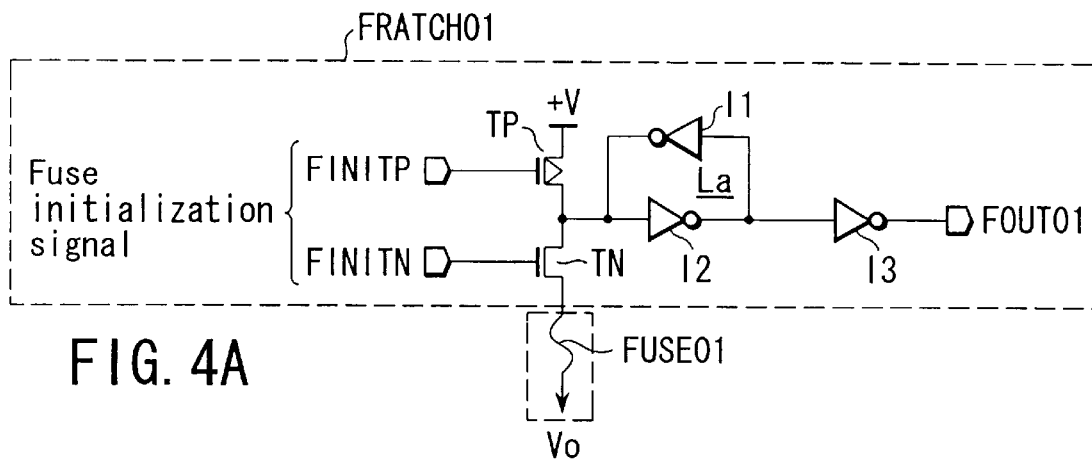
FIG. 4A is a block diagram showing the arrangements of a fuse and a fuse latch circuit of FIG. 3.

In the fuse latch circuit FLATCH01 of FIG. 4A, a P-channel transistor TP and an N-channel transistor TN are connected in series between a power supply terminal +V and the ground V0 together with the fuse FUSE01. Two types of fuse initialization signals FINITP and FINITN are supplied to the gates of the transistors TP and TN at a timing shown in FIG. 4B, respectively.

The connection node of the transistors TP and TN is connected to the input side of a latch circuit La composed of two inverters I1 and I2 connected in an inverse-parallel fashion to each other, and the output side of the latch circuit La is connected to an output terminal for outputting the output signal FOUT01 through an inverter I3.

Figure 4B:
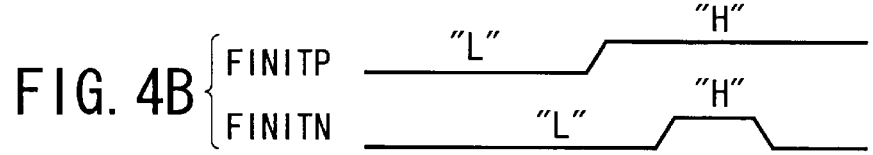
FIG. 4B is a time chart of a fuse initialization signal to explain the operation of the fuse and the fuse latch circuit of FIG. 3.

In the circuit of FIG. 4A, when the fuse initialization signal FINITP of FIG. 4B changes from "L" to "H", the transistor TP is turned off and the input of the latch circuit La is set at "H". Accordingly, when the fuse initialization signal FINITN goes to "H" thereafter, a signal corresponding to the presence or absence of blow-out of the fuse FUSE01 appears at/on the input side of the latch circuit La.

That is, when the fuse FUSE01 is not blown, since the L-signal of the ground V0 appears at/on the input side of the latch circuit La, the output signal FOUT01 goes to "L". When, however, the fuse FUSE01 is blown, the "H" signal remains at the input side of the latch circuit La, and thereby the output signal FOUT01 goes to "H".

(2) Second Embodiment

A second embodiment of the present invention is arranged such that it copes with a defect mode in which a plurality of elements in a memory system are made defective by the identical cause. That is, in the second embodiment, a plurality redundant elements, which can repair the plurality of defective elements in the defect mode are determined, and at least two fuse sets, which share a single master fuse, are determined from among the plurality of fuse sets corresponding to the redundant elements.

As described already, when the master fuse is shared by a plurality of fuse sets, the use of one fuse set results in the automatic use of the other fuse sets which share the master fuse. Accordingly, to use a certain fuse set, it is required that a plurality of redundant elements, which correspond to the plurality of fuse sets sharing the master fuse, are defect free.

It is assumed now that n-pieces of fuse sets share a single master fuse. When fuse sets, which correspond to m-pieces of redundant elements for relieving m-pieces of elements that were simultaneously made defective by the identical cause, do not share a master fuse each other, it is required that m×n pieces of redundant elements are defect free in order to relieve the m-pieces of the defective elements.

In contrast, when m<n as well as all the fuse sets, which correspond to the m-pieces of the redundant elements for relieving the m-pieces of the elements which were simultaneously made defective, share the master fuse, it is required that n-pieces of redundant elements are defect free in order to relieve the m-pieces of the defective elements.

Further, when m>n as well as the fuse sets, which correspond to the m-pieces of the redundant elements for relieving the m-pieces of the elements which were simultaneously made defective, are arranged to share the master fuse each other as far as possible, it is required that m-pieces of redundant elements (accurately, the number of the redundant elements is determined by dividing m by n and rounding up decimals, and multiplying a resultant quotient by n) are defect free in order to relieve the m-pieces of the defective elements.

As described above, in the second embodiment, the number of redundant elements which is required to be defect free can be reduced. Thus, it is possible to further suppress the decrease in a repairing efficiency which is caused by sharing the master fuse.

(3) Third Embodiment

A third embodiment of the present invention is arranged such that a plurality of fuse sets, which share a master fuse, are selected from among a plurality of fuse sets corresponding to a plurality of redundant elements capable of relieving a plurality of defective elements which are physically continuous and grouped, and the plurality of selected fuse sets sharing the master fuse are used.

There is a mode in which a plurality of elements, which are physically continuous and grouped, are made defective as one of defect modes in which a plurality of elements are simultaneously made defective by the identical cause. For example, this defect mode arises when defects are concentrated in a particular region on a memory array by dust which fell on chips in a chip manufacturing process.

Figure 5:
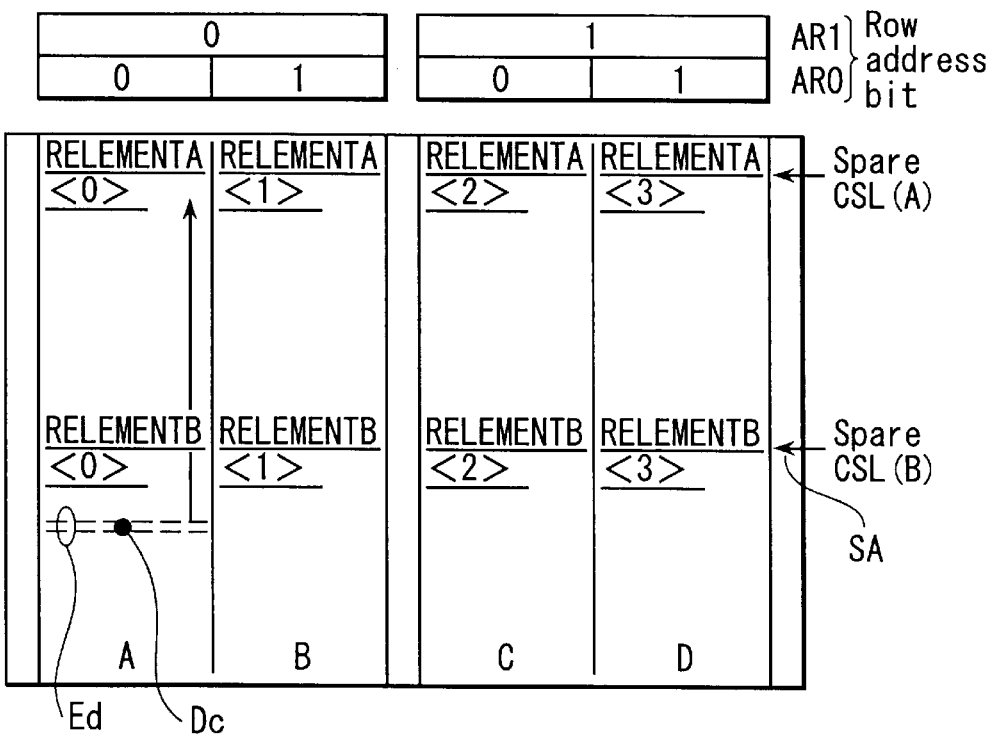
FIG. 5 is a block diagram showing the arrangement of a redundancy system of another embodiment of the present invention.

When, for example, a defect Dc in a cluster exists in a memory region A as shown in FIG. 5, redundant elements which can relieve two defective elements Ed including Dc are the redundant elements RELEMENTA<0> and RELEMENTB<0> which are located in the same memory region A. Numerals <0> to <3> in the figure mean that redundant elements correspond to No. 0 fuse set to No. 3 fuse set, respectively.

If the fuse sets of the redundant element RELEMENTA<0> and the redundant element RELEMENTA<2> share a master fuse similar to the case shown in FIG. 3 and the redundant element RELEMENTB<0> and the redundant element RELEMENTB<2> share a master fuse, it is required that a total 4 of the redundant elements RELEMENTA<0>, RELEMENTA<2>, RELEMENTB<0>, and RELEMENTB<2> are defect free to relieve the defect Dc. However, when the fuse sets of the redundant elements RELEMENTA<0> and RELEMENTB<0> share a master fuse, it is required that only the two redundant elements RELEMENTA<0> and RELEMENTB<0> are defect free.

Accordingly, the third embodiment can suppress the decrease in the relieving efficiency which is caused by sharing the master fuse, similarly to the second embodiment.

Note that while the effect of the embodiments of the present invention has been described as to the column redundancy system in which the column redundancy repair regions are set by the row addresses, it is obvious that the same effect can be obtained also by other redundancy systems. That is, this system can be also applied to an ordinary column redundancy system, in which a repair region is not set by row addresses, as well as to a row redundancy system. This is also applicable to the following embodiments similarly.

(4) Fourth Embodiment

A fourth embodiment of the present invention is a modification of the third embodiment. The fourth embodiment is arranged such that when a repair region corresponding to the redundant elements is a physically continuous region, a plurality of fuse sets, which share a master fuse, are selected among a plurality of fuse sets corresponding to a plurality of redundant elements in the same repair region.

As can be seen also in, for example, each of the regions A, B, C and D in FIG. 5, repair regions corresponding to fuse sets are physically continuous regions in many cases. Thus, it is possible to relieve a plurality of defective elements (defects of a cluster shape, and the like), which are physically continuous and grouped, by a plurality of redundant elements in the same repair region. With this arrangement, the same effect as that of the third embodiment can be obtained.

(5) Fifth Embodiment

A fifth embodiment of the present invention is arranged such that a plurality of fuse sets, which share a master fuse, are included in a plurality of fuse sets corresponding to a plurality of redundant elements which belong to the same spare column selection line (SCSL) in the column redundancy system in which column redundancy repair regions are set by the row addresses.

A semiconductor memory device such as a DRAM device includes a plurality of such fuse sets. In the memory device, there can be contemplated a system in which the area of a redundancy circuit is reduced by sharing, for example, the address comparators ACOMP01 to ACOMPn1 and the subsequent circuits in FIG. 3 by the plurality of fuse sets.

This system can be realized in a redundancy system in which only one fuse set is hit in the plurality of fuse sets sharing the address comparators, and moreover in which fuse sets which may be hit can be determined in advance without address comparison.

This is, for example, such a case that two or more fuse sets among a plurality fuse sets which share address comparators do not correspond to the same repair region and that there is only one repair region which is activated (in which an element is activated) in a plurality of repair regions (which are set to respective redundant elements which can be substituted for any defective elements in the regions) corresponding to the plurality of fuse sets sharing the address comparator.

More specifically, this is a system in which a column redundancy repair region is set by input row address signals in a column redundancy system in which a defective CSL is set to an inactivated state and a spare CSL is activated in place of it and substituted for it as shown in, for example, in FIG. 5. An overall memory array is divided into four column repair regions A, B, C, and D which are determined by, for example, row address signals AR0 and AR1. Then, column redundant elements RELEMENTA,B<0> to RELEMENTA,B<0> are provided with the respective column repair regions.

For example, when a spare CSL<A> is composed of the four redundant elements RELEMENTA<0> to RELEMENTA<3> which are determined by the input row address signals AR0 and AR1, and each of them corresponds to one fuse set, that is, they correspond to a total of 4 fuse sets, a different defective address can be programmed to each redundant element.

Here, it is not always necessary that a particular fuse set fixedly corresponds to a particular redundant element, and what is important is that any two fuse sets of the four fuse sets do not correspond to the same repair region.

Now, when a row address signal is input and a single word line is activated in the two memory blocks as a whole, the word line is located in any of the repair regions A, B, C, and D. When the spare CSL(A) in FIG. 5 is to be substituted for a defect in the activated word line, the redundant elements RELEMENTA<0> to RELEMENTA<3> are used to relieve the defect. This means that any two redundant elements of the redundant elements RELEMENTA<0> to RELEMENTA<3> are not used simultaneously, that there is a possibility that only one of the four fuse sets corresponding to the redundant elements RELEMENTA<0> to RELEMENTA<3> is hit, and that the one fuse set is determined by the input row address signals AR0 and AR1 without being determined by the address comparison of redundancy. In this case, it is possible to share, for example, the address comparators ACOMP01 and the subsequent circuits by the four fuse sets.

Figure 6:
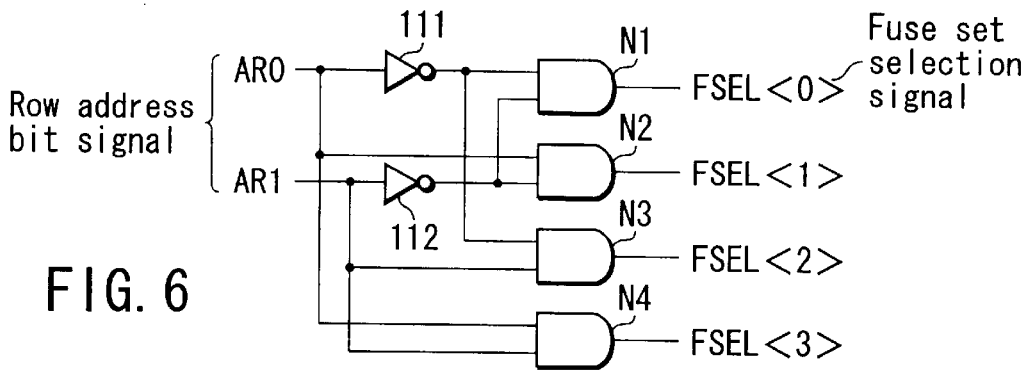
FIG. 6 is a block diagram showing the circuit arrangement of a fuse set selection signal generation circuit used in the embodiment of the present invention.
Figure 7:
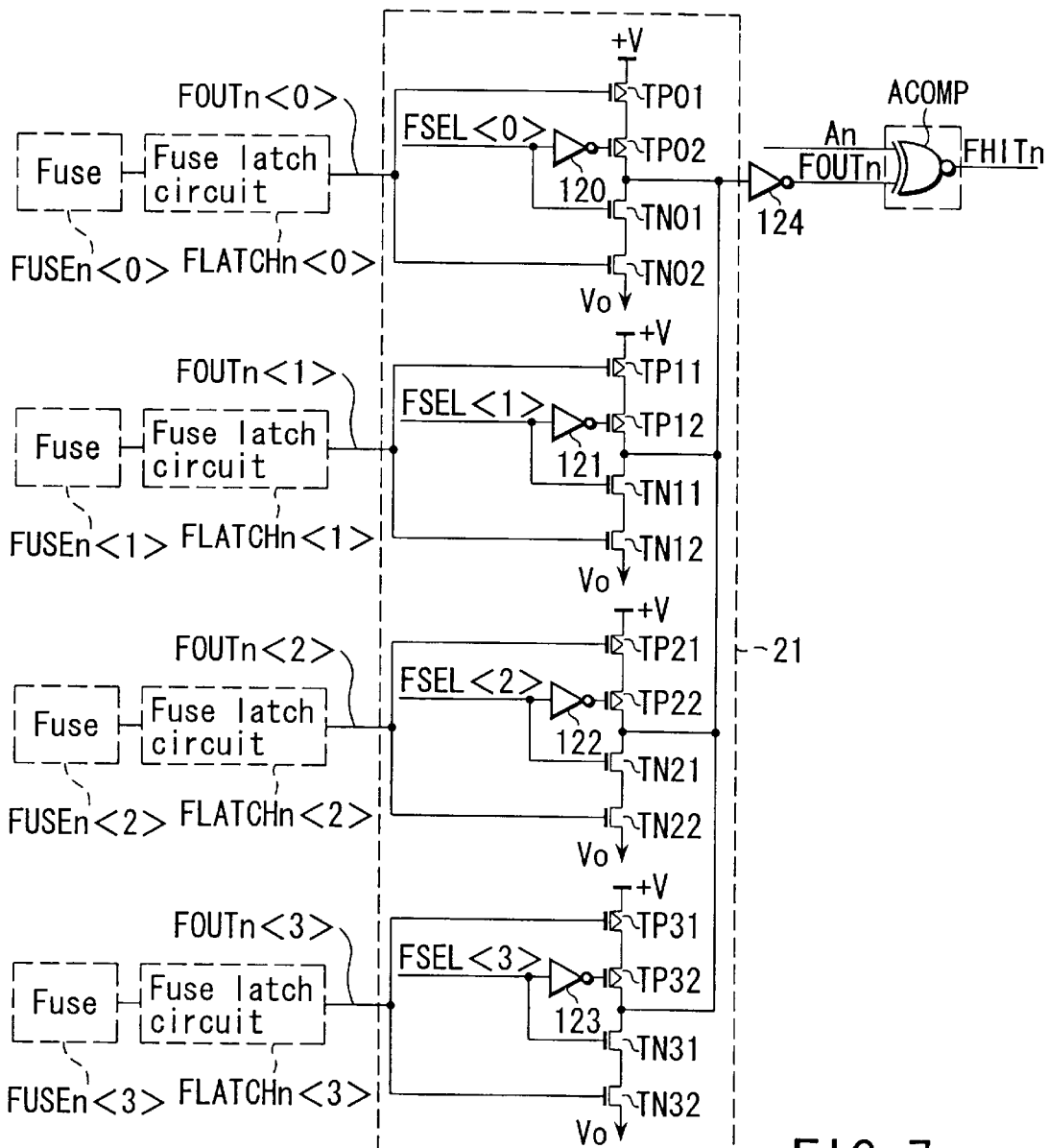
FIG. 7 is a block diagram showing the circuit arrangement of a fuse set selection circuit for address fuses used in another embodiment of the present invention.

Actually, a fuse set, which may be hit, is selected in advance (before a column address signal is input) using the outputs FSEL<0> to FSEL<3> of a circuit for generating fuse set selection signals (FSEL) based on row address bit signals AR0 and AR1 as shown in FIG. 6. Then, a plurality of fuse sets share the address comparators ACOMP and the subsequent circuits by using a fuse set selection circuit 21 as shown in FIG. 7.

In FIG. 6, a row address bit signal AR0 shown in FIG. 2 or FIG. 5 is input to an inverter I11 and to ones of the input terminals of AND circuits N2 and N4. Another row address bit signal AR1 is supplied to an inverter I12 as well as to one of the input terminals of a AND circuit N3 and to the other of the input terminals of the AND circuit N4.

The output from the inverter I11 is supplied to one of the input terminals of a AND circuit N1 as well as to the other of the input terminal of the AND circuit N3. The output from the inverter I12 is supplied to the others of the input terminals of the AND circuits N1 and N2.

As a result, the fuse set selection signals FSEL<0> to FSEL<3> of fuse sets Nos. 0 to 3 are output from the AND circuits N1 to N4, respectively.

The selection signals FSEL<0> to FSEL<3> are supplied to the input sides of the corresponding inverters I20 to I23 of the fuse set selection circuit 21 as well as to the gates of N-channel transistors TN01, TN11, TN21, and TN31, respectively. The output terminals of the inverters I20 to I23 are connected to the gates of P-channel transistors TP02, TP12, TP22, and TP32, respectively.

These transistors are connected in series between a power supply +V and the ground V0 together with other P-channel transistors TP01, TP11, TP21, and TP31 and other N-channel transistors TN02, TN12, TN22, and TN32. The gates of these transistors are connected to the output terminals of fuse latch circuits FLATCHn<0> to FLATCHn<3>, respectively and supplied with fuse outputs FOUTn<0> to FOUTn<3>.

When a fuse, which is selected by any of the fuse set selection signals FSEL<0–3> is blown as to the fuse set selection circuit 21 of FIG. 7, the two N-channel transistors are turned on together and the output from an inverter I24 goes to "H". When a corresponding address signal is set to "H" at that time, a hit signal FHITn is output from an address comparator ACOMP provided commonly.

In the column redundancy system in which the column redundancy repair regions are set by the row address signals, the same spare CSL is naturally activated, when an input address agrees with a program address, with respect to a plurality of fuse sets corresponding to a plurality of redundant elements which belong to the same spare column selection line (spare CSL). Therefore, the plurality of fuse sets and a control circuit for controlling the same spare CSL ought to be disposed together in the vicinity of the same spare CSL in layout in consideration of the connection of signal lines therebetween.

In contrast, a plurality of fuse sets corresponding to a plurality of redundant elements which belong to different spare CSLs need not be disposed together in layout because they are independent from each other from a circuit point of view, and the different spare CSLs are physically separated apart from each other in many cases.

Accordingly, when a plurality of fuse sets share a master fuse in the column redundancy system in which the column redundancy repair regions are set by the row address signals, if the plurality of fuse sets, which share the master fuse, is included in the plurality of fuse sets corresponding to the plurality of redundant elements which belong to the same spare column selection line (spare CSL), the layout of a redundancy circuit can be easily carried out. As a result, the layout area of the redundancy circuit can be reduced, which can contribute to the reduction of a chip size.

To describe an example with reference to FIG. 5, the master fuse is not shared by the fuse sets of the redundant elements RELEMENTA<0> and RELEMENTB<0> which belong to different spare CSLs (CSL(A) and CSL(B)), but the plurality of fuse sets, which share the master fuse, are included in the plurality of fuse sets corresponding to the plurality of redundant elements RELEMENTA<0> to RELEMENTA<3> which belong to, for example, the same spare column selection line SCSL(A).

Figure 8:
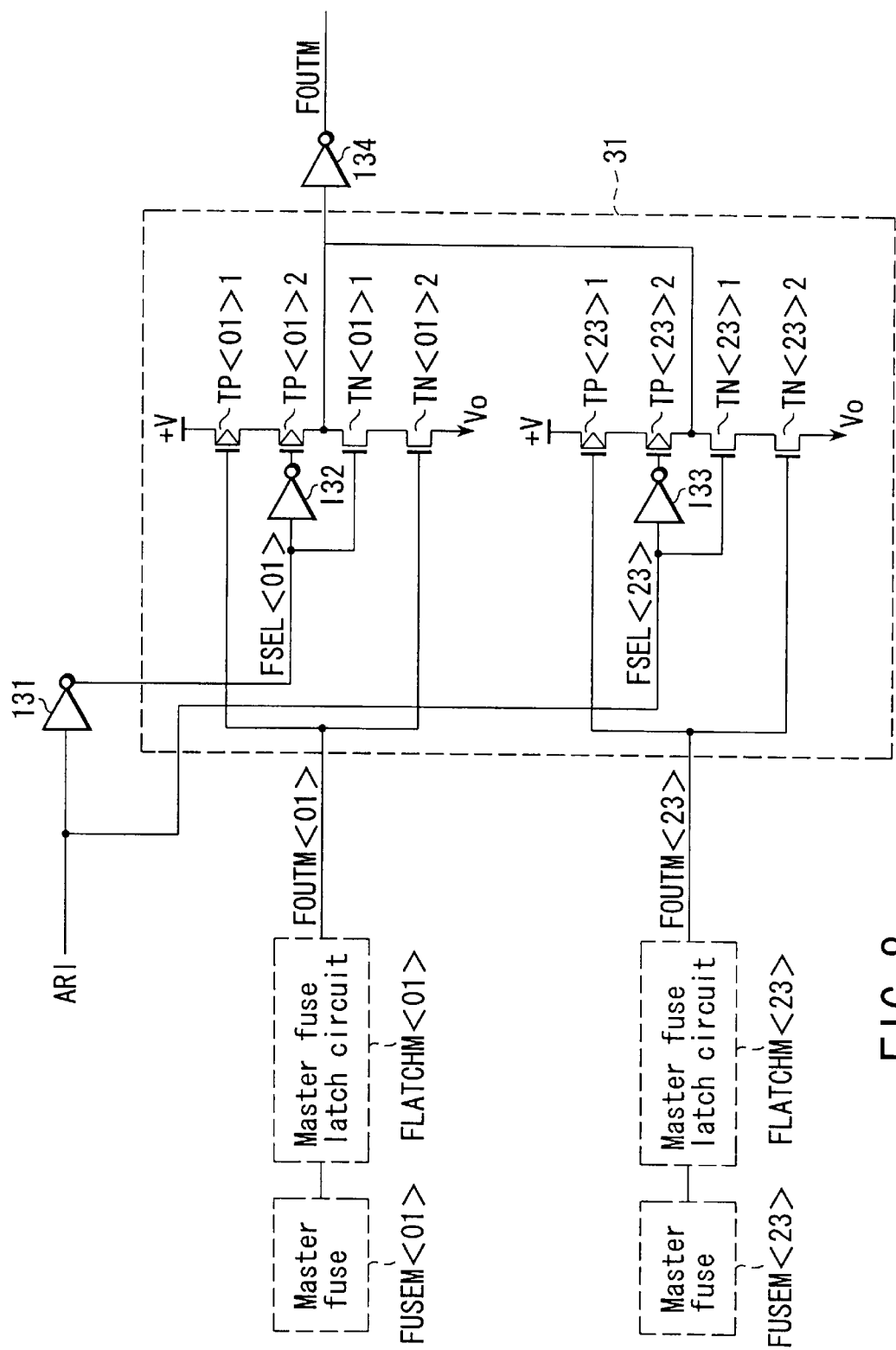
FIG. 8 is a block diagram showing the circuit arrangement of a fuse set selection circuit when a master fuse is shared in still another embodiment of the present invention.

FIG. 8 shows an example of the fuse set selection circuit when the master fuse is shared by the system shown in FIG. 5. In the circuit of FIG. 8, the row address bit AR1 is supplied to a fuse set selection circuit 31 as a fuse set selection signal FSEL<23>. That is, there are a case that the row address bit AR1 is inverted by an inverter I31 and then supplied to the fuse set selection circuit 31 and a case that the row address bit AR1 is directly supplied to the fuse set selection circuit 31.

The inverted row address bit AR1 is supplied further from the output terminal of the inverter I31 to the gate of a transistor TP<01>2 through an inverter I32 as well as to the gate of a transistor TN<01>1. In contrast, the row address bit AR1 is supplied to an inverter I33 without being inverted by the inverter I31, inverted by the inverter I33 and supplied to the gate of a transistor TP<23>2. Further, the row address bit AR1 is directly supplied to the gate of a transistor TN<23>1.

The transistors TP<01>2 and TN<01>1 are connected in series between a power supply terminal +V and the ground V0 together with transistors TP<01>1 and TN<01>2, whereas the transistors TP<23>2 and TN<23>1 are connected in series between the power supply terminal +V and the ground V0 together with transistors TP<23>1 and TN<23>2.

The output FOUTM<01> of one master fuse latch circuit FLATCHM<01> is supplied commonly to the gates of the transistors TP<01>1 and TN<01>2, and the output FOUTM<23> of the other master fuse latch circuit FLATCHM<23> is supplied commonly to the gates of the transistors TP<23>1 and TN<23>2.

In the fuse set selection circuit 31 of FIG. 8, when the row address bit AR1 is set to, for example, "L", the transistors TP<01>2 and TN<01>1 are turned on. At this time, when a master fuse FUSEM<01> is blown, the output FOUTM<01> of the master fuse latch circuit FLATCHM<01> goes to "H". At this time, no output is obtained from the selection circuit to which the inverter I33 is connected. Conversely, when the row address bit AR1 is set to "H", an output is obtained from the selection circuit to which the inverter I33 is connected.

The above description has been made as to the column redundancy system, in which the column redundancy repair regions are set by the row address signals as well as the address comparators ACOMPn and the subsequent circuits are shared by the plurality of fuse sets, as an example. However, even if the address comparator ACOMPn and the subsequent circuits are not shared, the same situation can be obtained in that a plurality of fuse sets corresponding to a plurality of redundant elements which belong to the same spare column selection line (spare CSL) has the same space CSL which is activated when an input address agrees with a program address. Accordingly, the effect of the embodiment can be obtained similarly also in this case.

(6) Sixth Embodiment

A sixth embodiment of the present invention is arranged such that when column redundancy repair regions are set so as to divide a bit line in the column redundancy system, in which the column redundancy repair regions are set by the row address signals, a plurality of fuse sets, which share a master fuse, are included in a plurality of fuse sets corresponding to redundant elements to a plurality of each other different repair regions in a plurality of repair regions which divide the same bit line. The sixth embodiment is one specific example of the second embodiment.

In a semiconductor memory device such as a DRAM, there is a defect called a column failure which extends in the direction in which the bit line pairs extend. This defect is found when adjacent bit lines are short-circuited or when a so-called cross failure is arisen by the short-circuiting between a word line and a bit line. The column failure not only makes entire bit line pairs defective but also makes the cells belonging to one side of bit line pair defective and makes only a part of the bit line pairs defective. In any case, it is a feature of the column failure that the plurality of cells belonging to the same bit line pairs are made defective by the same cause.

Figure 9:
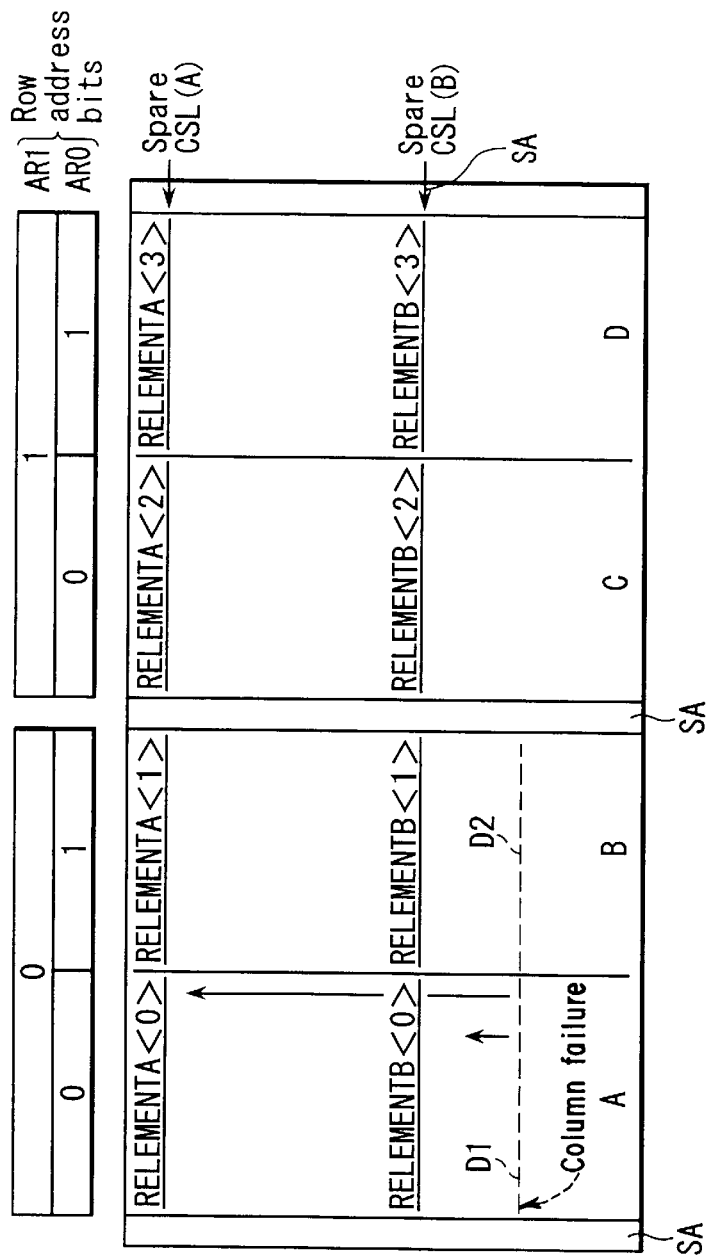
FIG. 9 is a block diagram showing the arrangement of a plurality of redundant elements capable of relieving a column defect in still another embodiment of the present invention.

In, for example, a memory array shown in FIG. 9, bit line pairs, which travel in the same direction as that of CSLs in the memory blocks surrounded by two sense amplifier regions, are alternately connected to right and left sense amplifiers (not shown). When four column repair regions are set in the memory array using row address signals AR0 and AR1, a plurality of memory cells, which constitute the bit line pairs, are classified into two repair regions. That is, the repair regions are set so as to divide the bit lines.

When two defective elements D1 and D2 including a column failure are located over repair regions A and B as shown in FIG. 9, two redundant elements, which can relieve the two defective elements D1 and D2, are a combination of any one of the redundant elements RELEMENTA<0> and RELEMENTB<0> to the repair region A and any one of the redundant elements RELEMENTA<1> and RELEMENTB<1> to the repair region B.

When a master fuse is shared by two fuse sets corresponding to the combination of the two redundant elements, only two redundant elements are required to be defect free when the two defective elements including the column failure are relieved.

In contrast, when a master fuse is shared by the fuse sets of the redundant elements RELEMENTA<0> and RELEMENTB<0> and a master fuse is shared by the fuse sets of the redundant elements RELEMENTA<1> and RELEMENTB<1>, it is required that the four redundant elements RELEMENTA,B<0> and RELEMENTA,B<1> are defect free.

Accordingly, the number of the redundant elements which are required to be defect free can be reduced by the sixth embodiment. Thus, it is possible to suppress the decrease in the repairing efficiency which is caused by sharing the master fuse.

(7) Seventh Embodiment

A seventh embodiment of the present invention is arranged such that when column redundancy repair regions are set so as to divide bit lines in the column redundancy system, in which the column redundancy relieving repair are set by the row address signals, a plurality of fuse sets, which share a master fuse, are included in a plurality of fuse sets corresponding to a plurality of redundant elements belonging to the same spare column selection line in a plurality of redundant elements to a plurality of each other different repair regions in a plurality of repair regions which divide the same bit line.

The seventh embodiment is arranged as a combination of the fifth embodiment and the sixth embodiment. For example, the master fuse is shared for the two fuse sets when the two fuse sets correspond to a combination of redundant elements RELEMENTA<0, 1> or a combination of redundant elements RELEMENTB<0, 1>, each of which belongs to the same column selection line, among two combinations in one of which any one of the redundant elements RELEMENTA<0> and RELEMENTB<0> to a repair region A is combined with any one of the redundant elements RELEMENTA<1> and RELEMENTB<1> to a repair region B and in the other of which the other of the former redundant elements is combined with the other of the latter redundant elements.

With this arrangement, a redundancy system can be obtained which has the effect of the sixth embodiment that the number of the redundant elements which are required to be defect free can be reduced and that the decrease in the repairing efficiency, which is caused by sharing the master fuse, can be suppressed as well as which has the effect of the fifth embodiment that the layout area of a redundancy circuit can be reduced and a chip size can be reduced.

(8) Eighth Embodiment

An eighth embodiment of the present invention is arranged such that, in the column redundancy system in which the column redundancy repair regions are set by the row address signals, a plurality of fuse sets, which share a master fuse, are determined from among a plurality of fuse sets corresponding to a plurality of redundant elements which can repair a plurality of elements sharing the same sense amplifier in a plurality of redundant elements which belong to the same spare column selection line (spare CSL).

The eighth embodiment is arranged as a combination of the second embodiment and the fifth embodiment of the present invention. In an array arrangement in which a sense amplifier is shared by bit line pairs in adjacent memory blocks, column failure may appear at the same time on the bit lines pairs on both the sides which share the sense amplifier due to the failure of the sense amplifier itself. Further, a column failure due to a cross failure in the memory block on one side may extend to an opposite side through the sense amplifier.

Figure 10:
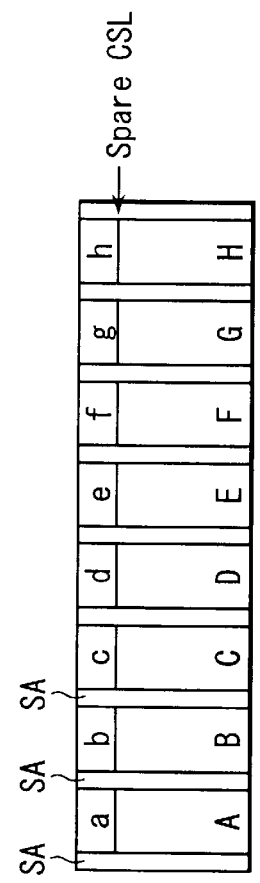
FIG. 10 is a block diagram showing an array arrangement in which a spare CSL in still another embodiment of the present invention is composed of a plurality of redundant elements in which a sense amplifier is shared.

The embodiment is explained by use of an arrangement such that an overall memory array is composed of eight column repair regions A to H depending on row address signals as shown in, for example, FIG. 10. In this arrangement, when two fuse sets, which share a master fuse, are selected from among fuse sets corresponding to redundant elements "a" to "h" which belong to the same spare column selection line, the fuse sets, which correspond to the combinations of the redundant elements which share a sense amplifier such as the combinations of the redundant elements (a, b), (c, d), (e, f), and (g, h), share a master fuse in place of that the fuse sets, which correspond to the combinations of the redundant elements (a, e), (b, f), (c, g), and (d, h), share the master fuse.

With this arrangement, a redundancy system can be realized which has the effect of the second embodiment that when a column failure, which appears on the bit lines on both the sides that share a sense amplifier due to the defect of the sense amplifier itself, is relieved, the number of the redundant elements which are required to be defect free can be reduced and that the decrease in the repairing efficiency, which is caused by sharing the master fuse, can be suppressed as well as which has the effect of the fifth embodiment that the layout area of a redundancy circuit can be reduced and a chip size can be also reduced.

While FIG. 10 shows that only one redundant element is disposed in each repair region, it is a matter of course that a plurality of redundant elements may be disposed in each repair region. In this case, it is also possible to select redundant elements from respective repair regions which are located adjacent with each other across a sense amplifier shared thereby, and to select at least two fuse sets, which share a master fuse, from among a plurality of fuse sets in correspondence to the combination of the redundant elements.

(9) Ninth Embodiment

A ninth embodiment of the present invention is arranged such that when the master fuse and address fuses are blown and a defective address is programmed to a certain fuse set, an address, which is physically adjacent to the address programmed to the fuse set used to substitute a defect, is programmed to a fuse set, which is not used to substitute for the defect, among the other fuse sets which share the master fuse.

When a master fuse is blown to use a certain fuse set, the other fuse sets sharing the master fuse are made also operative. Thus, the redundant elements corresponding to the other fuse sets are substituted for normal elements in accordance with input address signals. That is, normal elements are substituted even if they are not defective elements.

Thus, it is necessary to test whether or not each redundant element is defective before fuses are blown. An addition of a predetermined test circuit to, for example, the embodiment of FIG. 2 can construct a redundancy system having a redundancy test function for testing whether or not each redundant element is defective before fuses are blown.

Figure 11:
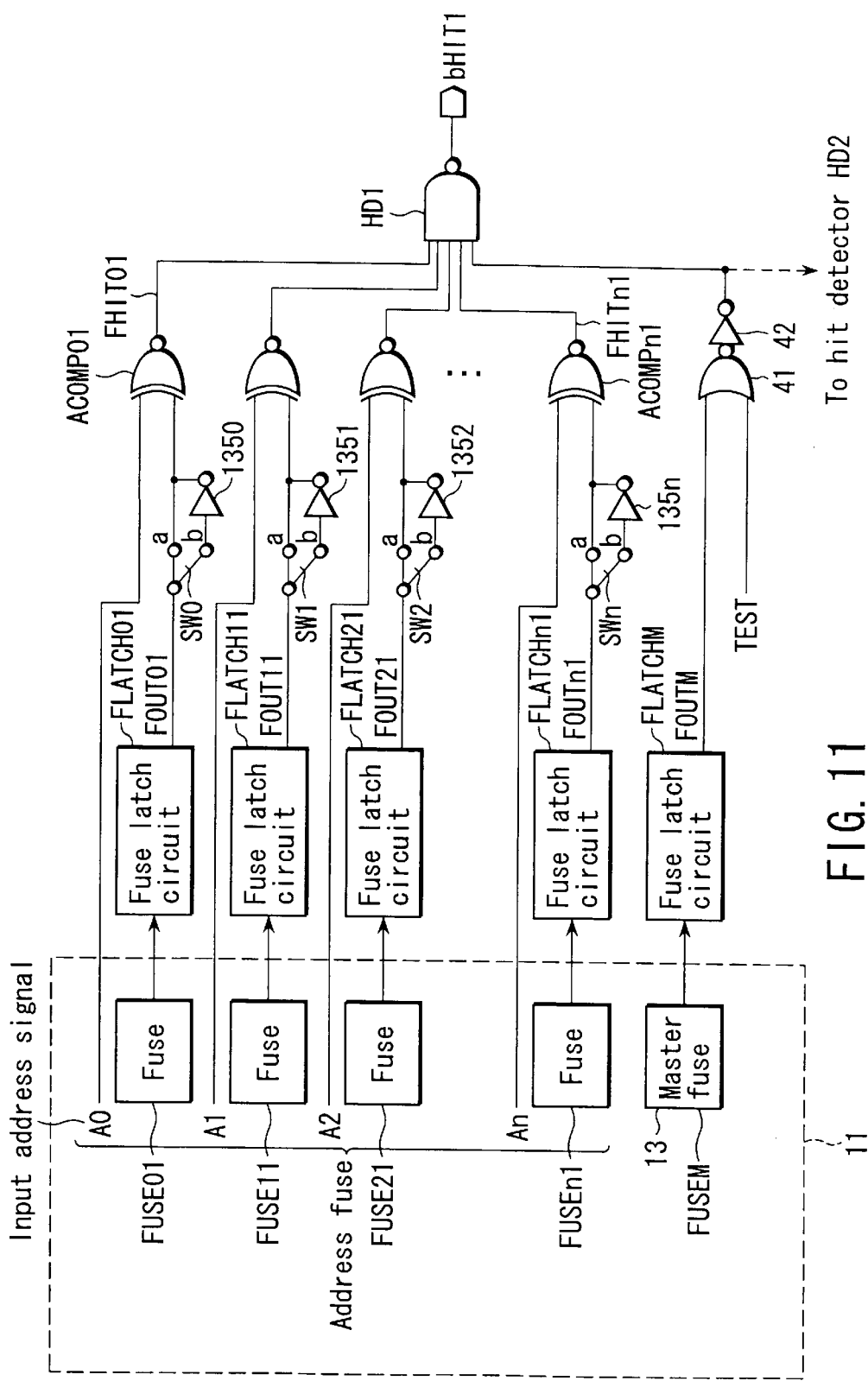
FIG. 11 is a block diagram showing a circuit arrangement of a modification in which a redundancy test function is provided with the embodiment shown in FIG. 2.

FIG. 11 shows the circuit arrangement of a modification of a redundancy system in which the redundancy test function is assembled to the embodiment shown in FIG. 3. The circuit shown in FIG. 11 is the same as the circuit of the embodiment of FIG. 3 when the test circuit portion is removed therefrom. Thus, FIG. 11 shows only the one fuse set 11 in the upper half portion of FIG. 3 as well as the same reference numerals as used in FIG. 3 are used in FIG. 11 to denote the same parts, and the description thereof is omitted.

In FIG. 11, the outputs FOUT01 to FOUTn1 of fuse latch circuits FLATCH01 to FLATCHn1 are connected to the input terminals "a" or "b" of comparators ACOMP01 to ACOMPn1 through switches SW0 to SWn in correspondence to a fuse set 11. The input terminals "a" are connected directly to the address comparators ACOMP01 to ACOMPn1, and the input terminals "b" are connected thereto through inverters I350 to I35n, respectively.

The difference of the connection of the FOUT01 to FOUTn1 to the input terminals "a" or "b" can change whether or not the outputs FHIT01 to FHITn1 are activated as to each address depending upon whether the input address signals A0 to An are set to "H" or "L" before fuses are blown.

That is, when the respective fuse latch circuits FLATCH01 to FLATCHn1 are arranged a shown in FIG. 4A, any of the outputs FOUT01 to FOUTn1 goes to "L" after fuse initialization. Thus, when the outputs FOUT01 to FOUTn1 are connected to the terminals "a" and the input address signals are set to "L", the outputs FHIT01 to FHITn1 go to "H", whereas the outputs FOUT01 to FOUTn1 are connected to the terminals "b" and the input address signals are set to "H", the outputs FHIT01 to FHITn1 go to "H".

A redundancy test signal TEST is supplied to a NOR circuit 41 together with the fuse latch output FOUTM of a master fuse FUSEM, and the output from the NOR circuit 41 is supplied to a hit detector HD1 through an inverter 42. The connection of the another fuse set 12 shown in FIG. 3 is carried out in the same way.

Then, the inputs of this address comparators relative to all the address fuses in the fuse set 11 are connected by a method which is unique to the fuse set 11, and the fuse set 12 also has a unique address fuse input connection similarly. Likewise, when a master fuse is commonly provided with three or more fuse sets, each of the fuse sets has a unique address fuse connection.

In the redundancy test, a virtual state, in which the master fuse FUSEM is blown and the output FOUTM goes to "H", is created by setting the test signal TEST to "H". Then, the respective redundant elements can be tested by selectively hitting only a particular fuse set, for example, only the fuse set 11 by inputting a certain address (called a "preprogrammed address") which is determined depending upon the connection of the inputs to the address comparators for each of the fuse sets 11 and 12 which share the master fuse FUSEM.

That is, when a redundancy system has a redundancy test function, a redundant element, in which the master fuse is blown and which is not yet used, is substituted for a normal element corresponding to an address preprogrammed to a fuse set (for redundancy test). In the embodiment of the present invention, however, when a part of the plurality of fuse sets sharing the master fuse is used for the substitution of a defective element, an address, which is physically adjacent to that of the defective element, is positively programmed to the other fuse sets sharing the master fuse which are not used for the substitution of the defective element.

This arrangement copes with a possibility that a defect in a cluster, which is caused by dust fell on chips in a chip manufacturing process as described above, further grows after fuses are blown. With this arrangement, a probability that chips are made defective after fuses are blown regardless of the substitution performed by redundant elements can be reduced.

(10) Tenth Embodiment

A tenth embodiment of the present invention is arranged such that when a master fuse and one or more address fuses are blown and a defective column address is programmed to a certain fuse set in the fifth to eighth embodiments, the same address as the column address programmed to the fuse set used for the substitution of a defect is programmed to a fuse set, which is not used for the substitution of the defect, among the other fuse sets sharing the master fuse.

Figure 12:
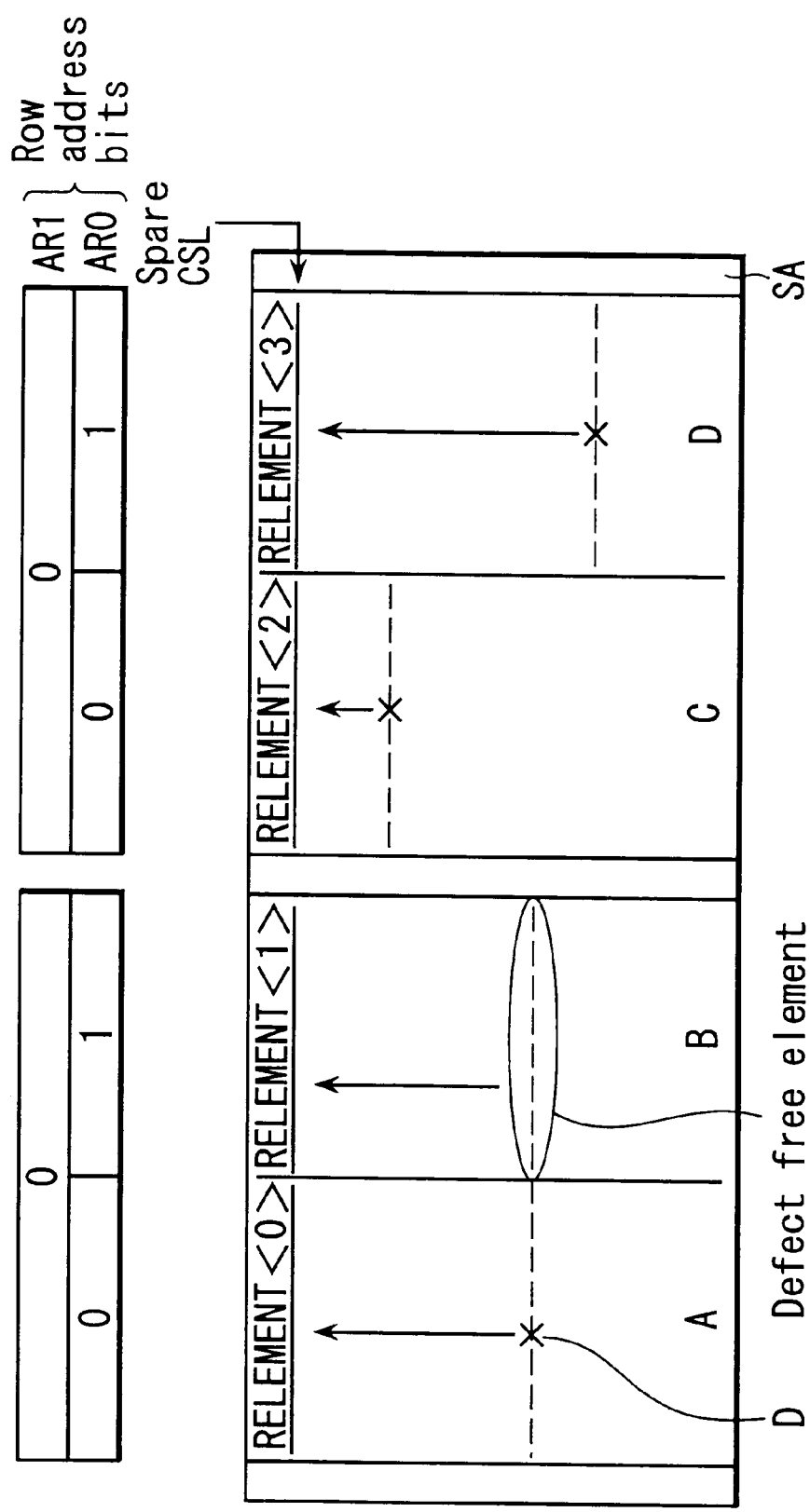
FIG. 12 is a block diagram showing the arrangement of a redundancy system in still another embodiment of the present invention.

FIG. 12 is a view schematically showing the tenth embodiment. Since a repair region A includes a defective element D, a defective address is programmed to the fuse set of a redundant element RELEMENT<0>.

In contrast, assuming that there is no defective element in a repair region B to a redundant element RELMENT<1> corresponding to a fuse set which shares the master fuse together with the above fuse set. Thus, when the fuse set is not programmed for replacement, a defect free normal element corresponding to the preprogram address described above is substituted.

In the tenth embodiment, the address of the defective element D programmed to the fuse set sharing the master fuse is positively programmed also to the other fuse set sharing the master fuse which is not used to relieve a defect.

This arrangement copes with a possibility that the defect grows in a CSL direction or the direction in which BL extends, after fuses are blown, and thereby a probability that chips are made defective after blown regardless of the substitution performed by a redundant element can be reduced.

(11) Eleventh Embodiment

Figure 16A:
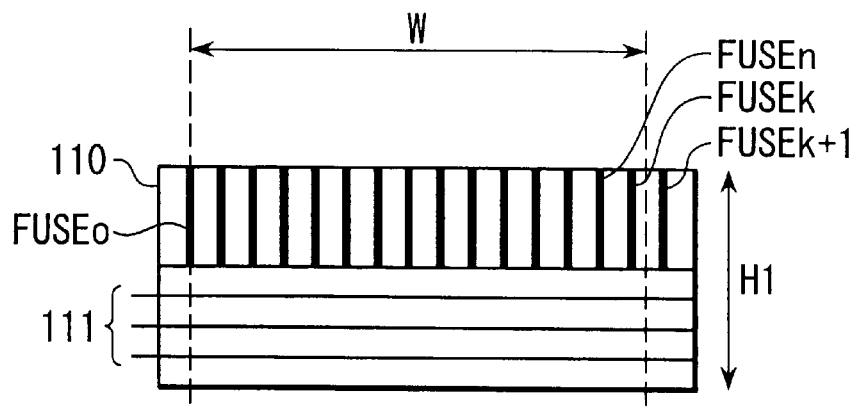
FIG. 16A is a view showing an example of a conventional layout of fuses.
Figure 16B:
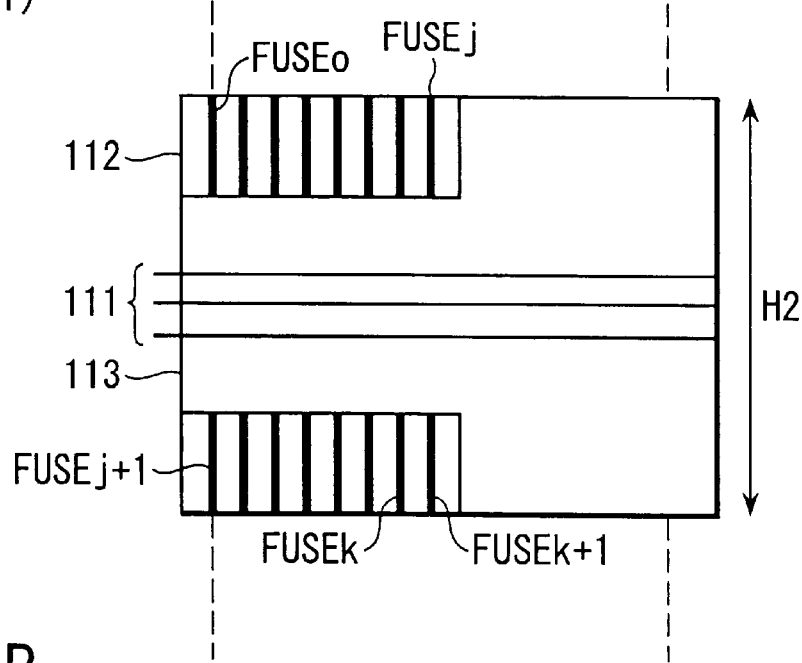
FIG. 16B is a view showing an example of a conventional different layout of fuses.

Incidentally, as described above with reference to FIG. 16B, when there are a multiplicity of redundant elements necessary to a memory array, fuses may be disposed in two stages of fuse bank in layout because they cannot be disposed in one stage of fuse bank. In this case, address signal lines for input address signals, which are used commonly, are disposed between the two stages of the fuse bank. In addition, fuse latch circuits for latching the outputs from fuses, address comparators for comparing the outputs from the fuse latch circuits with input address signals, a hit detector for determining whether or not a redundancy system is to be activated based on the outputs from the address comparators, and the like are disposed between the address signal lines and each of the two stages of fuse bank.

The outputs from the circuits between the two stages of the fuse banks must be finally fetched to the outside, and lines for this purpose are derived to the outside through the gaps formed between the fuses. When many fuses are disposed, however, it is difficult to secure the gaps through which the lines passes. While it is contemplated to cope with this problem by reducing the pitches of the fuses, there is a limit in the reduction of the fuse pitches.

Figure 13:
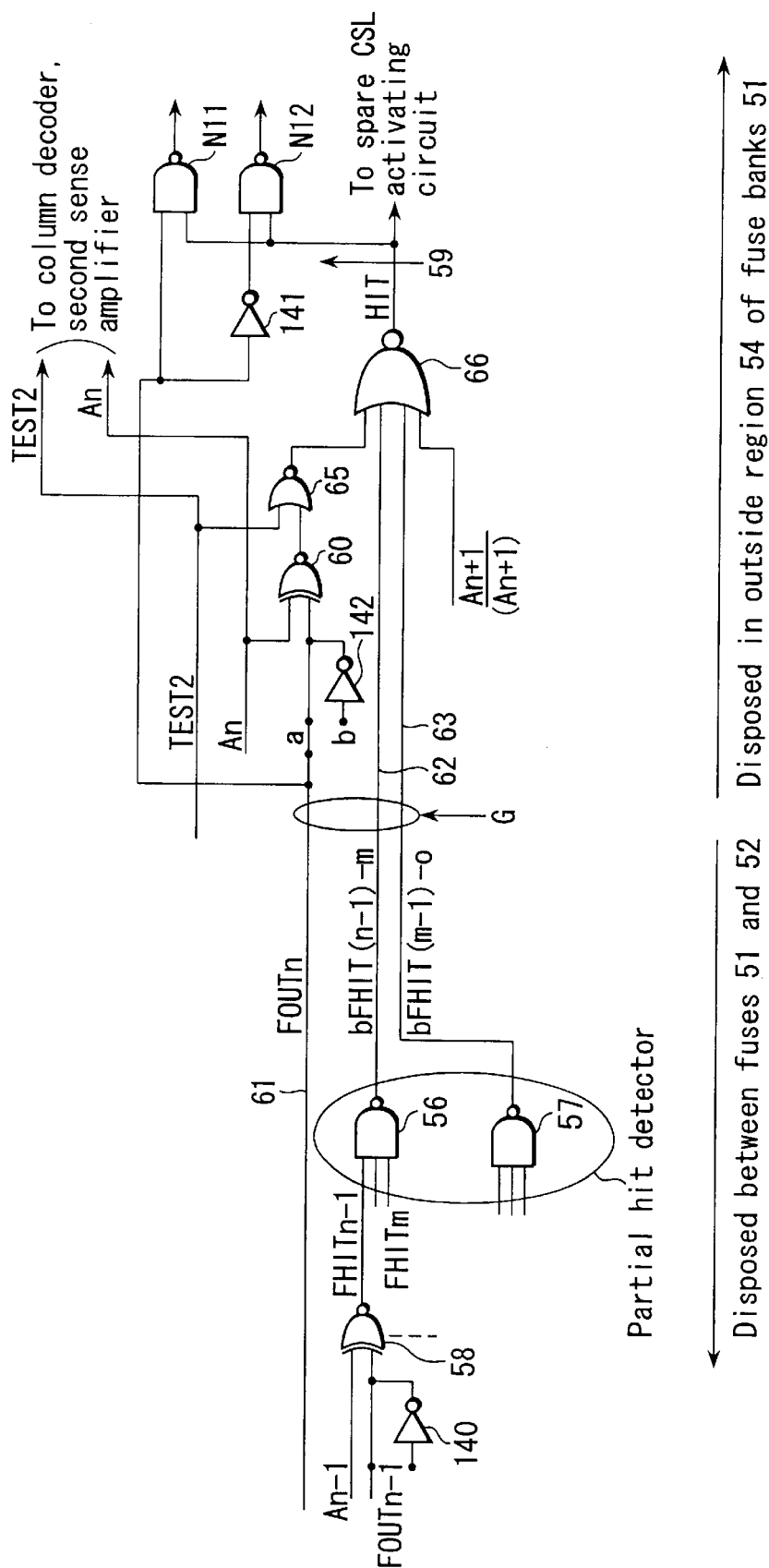
FIG. 13 is a block diagram showing the circuit arrangement of a redundancy system in still another embodiment of the present invention.

FIG. 13 is a block diagram showing the circuit arrangement of an embodiment for solving this problem. When fuses are disposed in a plurality of stages of fuse row (the fuse banks) in layout, at least one of address lines necessary to address comparison is arranged to the outside of a fuse row, for example, to the outside region 54 of a first fuse bank 51 of FIG. 14. That is, as shown in FIG. 14, the outside region 54 is defined as a side opposite to the side where a fuse latch circuits 53 and the like with respect to the first fuse banks 51 or a second fuse bank 52.

Figure 14:
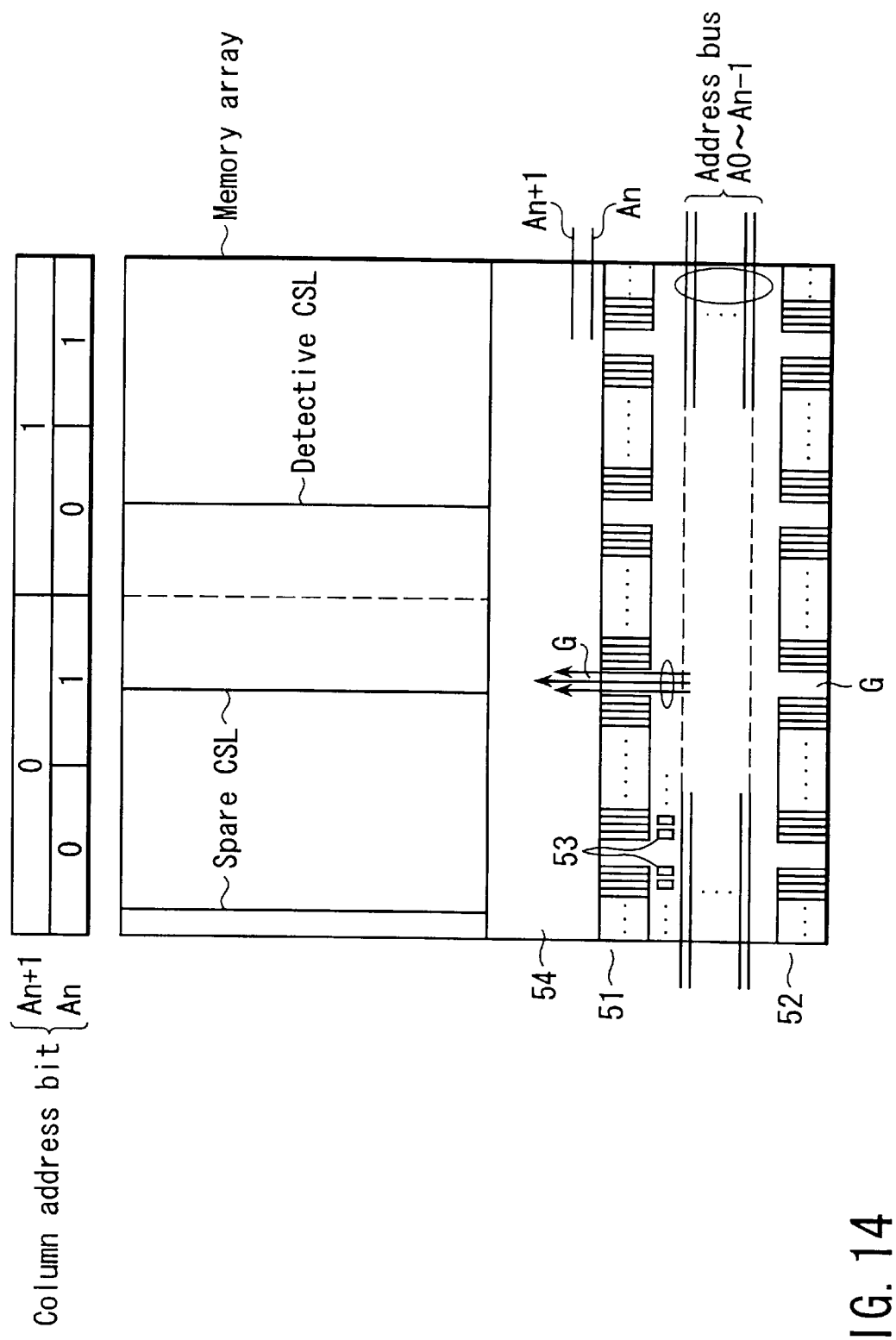
FIG. 14 is a block diagram showing a state in which fuse banks in the redundancy system shown in FIG. 12 are disposed in two stages.
Figure 15:
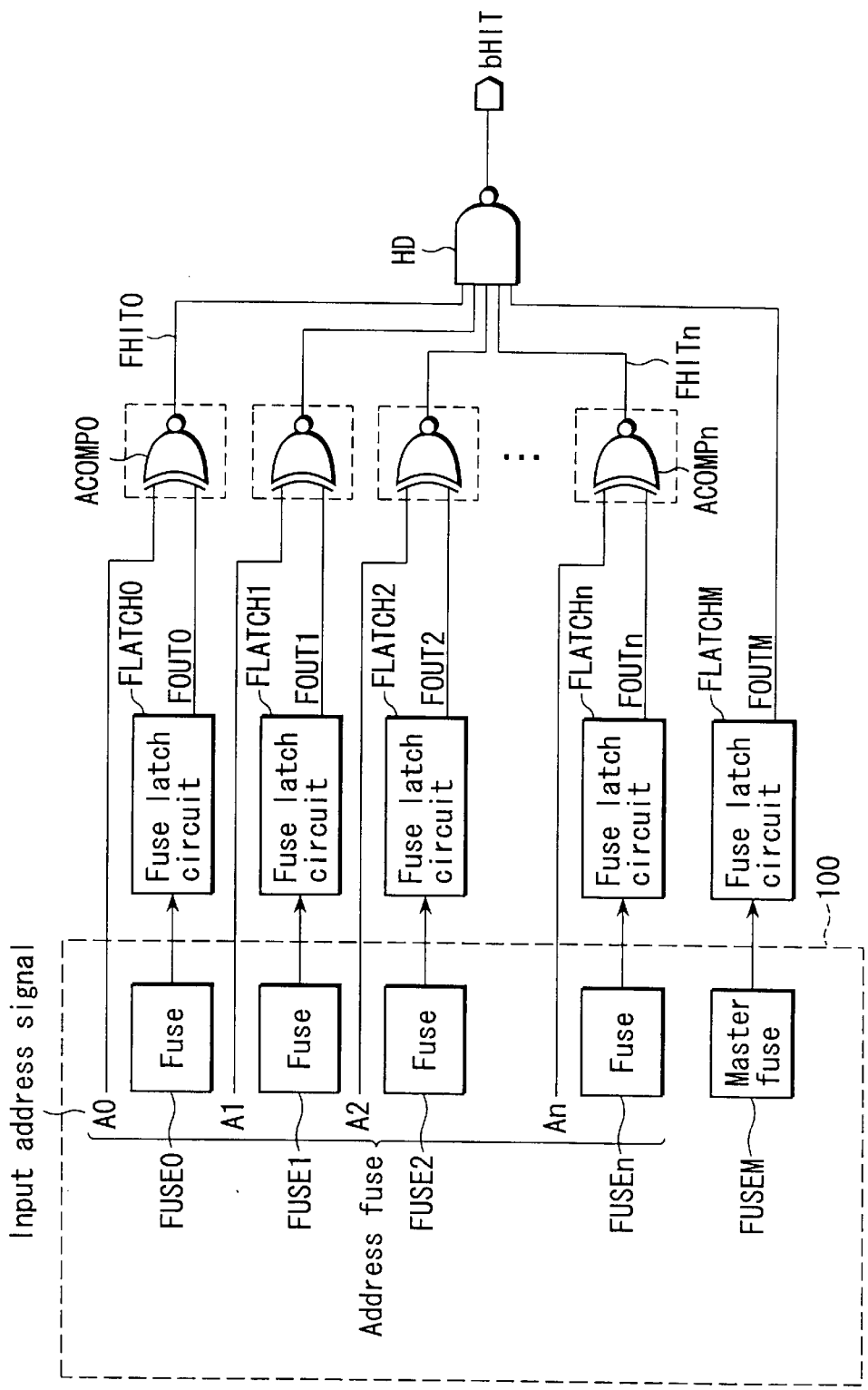
FIG. 15 is a block diagram showing an example of the circuit arrangement of a conventional redundancy system.

In the arrangement shown in FIG. 14, an address line An necessary to address comparison is disposed in the outside region 54 together with an address line An+1, and an address bus composed of address lines A0 to An−1 is disposed in the region between the fuse banks 51 and 52. Note that symbol "G" in FIG. 14 shows gaps formed in the fuse rows.

In the embodiment of FIG. 13, a signal line 61 for a fuse latch signal FOUTn, a signal line 62 for the output bFHIT (n−1)-m from a partial hit detector 56, and a signal line 63 for the output bFHIT(m−1)-0 from a partial hit detector 57 pass through each gap G between the fuses. Each of the partial hit detectors 56 and 57 is composed of a NAND circuit. The output from an address comparator 58 is supplied to one of the inputs of the partial hit detectors 56 and 57. The address comparator 58 is composed of an Ex-NOR circuit and to which an address signal An−1 similar to that of the embodiment of FIG. 3, the output FOUTn−1 from a fuse latch circuit or the output from an inverter I40 are supplied.

The signal line 61 is connected to a normal element inactivating (disabling) signal generation circuit 59 composed of an inverter I41 and NAND circuits N11 and N12. Further, the signal of the signal line 61 is connected to an address comparator 60 together with the signal of the address line An, which is disposed in the outside region 54, and the output from an inverter I42.

The output from the address comparator 60 is supplied to a NOR circuit 65 together with an address signal bypass control signal TEST2 which will be described later. The output from the NOR circuit 65 is supplied to a hit detector 66 together with the signals of the signal lines 62 and 63 and the address signal of the address line An+1. The output HIT from the hit detector 66 is supplied to a spare CSL activation circuit (not shown).

Note that the control signal TEST2 and an address signal An and an address signal An+1 (/An+1) are supplied to column decoders (not shown) formed in the outside region 54.

The above disposition permits the address comparator 60, which corresponds to the address line An disposed in the outside region 54, to be also disposed in the outside region 54, which reduces the number of the circuits to be disposed between the fuse banks 51 and 52 accordingly, whereby the layout of the overall circuits including the circuits disposed in the outside region can be optimized. This is because the outside region 54 generally has a spatial allowance in layout.

Further, in general, redundancy output signals such as the output from the address comparator 60 are signals which transits each time an address input changes. Thus, attention must be paid to reduce a parasitic capacitance by, for example, decreasing a line length. The disposition of the address comparator 60 in the outside region 54 of the fuse bank as in the embodiment causes the wire 61 for the output FOUTn from the fuse latch circuit to pass through each gap G between the fuses. However, since a signal transmitting through the wire 61 is determined at the initialization and thereafter is maintained as a signal which does not transit as described in FIGS. 4A and 4B, the signal transmitting through the wire 61 is less affected by parasitic capacitance even if the wire length thereof increases.

Further, since the hit detector 66 is disposed in the outside region 54 of the fuse bank, when the address comparator 60 is also disposed in the outside region 54 in layout as described above, the wire length of the redundancy output signals such as the output from the address comparator 60 can be reduced, and thereby a redundancy system with higher speed can be constructed by reducing parasitic capacitance.

Further, since both the address signal line An and the corresponding address comparator 60 are disposed in the outside region 54, the wiring length of a local address line derived from the address line running along the fuse bank to the address comparator 60 can be shortened. Accordingly, the parasitic capacitance on the address signal can be reduced.

Since there are many fuse sets, there are many address comparators that correspond to a certain address signal, and thus there are also many local address lines derived from an address line. Therefore, it is important to shorten the wiring length of the local address lines. As a result, it is an ordinary practice to dispose the address comparator 60 and the corresponding address line on the same side of the fuse bank.

Further, a wire for an address signal An, which is necessary to address comparison as well as also necessary to column decoders or second sense amplifiers, and the like, is disposed in the outside region 54 in FIG. 14. This arrangement makes it unnecessary to pass the local wire for the address signal through each gap G between the fuses, which can provide an allowance with the fuse pitches in the fuse bank 51 by reducing the width of each gap G between the fuses.

Further, since the length of the local wire of the address line can be reduced, the redundancy system can be operated at high speed by reducing parasitic capacitance.

The overall memory array of redundancy system shown in FIGS. 13 and 14 is divided into two regions by the column address bit signal An+1, and each region is arranged as a repair region corresponding to each redundant element (spare CSL).

Further, only one element (CSL) is activated in each repair region in a normal operation. However, a plurality of elements (two elements) can be simultaneously activated in each repair region by bypassing the address signal An by setting the address signal bypass control signal TEST2 to "H".

Furthermore, the address signal bypass control signal TEST2 is also supplied to the NOR circuit 65 together with the output from the address comparator 60 as shown in FIG.

13. Accordingly, it is possible, in an operation mode (TEST2="H"), in which a plurality of elements (two elements) are simultaneously activated in a repair region, to determine whether or not an input address agrees with a program address without depending upon the address signal An which discriminates the two elements in the normal mode.

When any one of the plurality of elements, which are simultaneously activated in each repair region in the above mode, is defective (has a defect), the defective element must be selectively substituted for a redundant element.

In the redundancy system arranged as described above, the address signal line An for discriminating a plurality of elements, which are simultaneously activated in a repair region in a certain operation mode, in a different operation mode (normal mode) is disposed in the outside region 54 which has the spatial allowance.

As described above, when a redundant element is selectively substituted for an element among a plurality of elements activated together in a repair region in a certain operation mode, the output FOUTn of the fuse latch circuit of an address fuse corresponding to an address signal An for discriminating the plurality of elements activated together at the normal mode is input to the address comparator 60 as well as also to the normal element inactivating (disabling) signal generation circuit 59.

With this operation, when the input address agrees with the program address and the output from the hit detector 66 is set to "H", the output from any of the NAND circuits N11 and N12 is activated depending upon a state of the output FOUTn, and any of a plurality of elements that ought to be simultaneously activated in a repair region can be selectively disabled. As long as the normal element inactivating signal generation circuit 59 is disposed in the outside region 54, wiring for the output FOUTn must be passed through each gap G between the fuses. Since the output FOUTn is derived into the outside region 54, it is easy to dispose the address comparator 60, to which the output FOUTn is supplied, and the wiring for the address signal An, which is supplied to the address comparator 60, in the outside region 54. If the address comparator 60 and the wiring of the address signal An are disposed in an inside region, the signal line of the signal output from the address comparator 60 must be also passed through each gap G between fuses. Accordingly, when the address signal wiring of the address signal for discriminating a plurality of elements, which are simultaneously activated in a repair region in the memory array in a certain operation mode, in a different operation mode or the address comparator corresponding to the address signal line are disposed in the outside region 54, the number of the output signal wirings for the outputs from the redundancy circuits such the outputs from the partial hit detectors 56 and 57, which must be passed through each gap between the fuse rows, can be reduced, which can further provide the fuse pitches with an allowance.

Further, the address signal wiring An, the address information of which is bypassed in a special operation such as a test mode, and the like, among the address signal wirings necessary to address comparison, can be disposed in the outside region 54.

That is, when the wiring of the address signal whose address information address information is bypassed is disposed in the inside of the banks 51, 52, the local line of the address signal must be passed through each gap G, because the address signal is also used by the column decoders or the second sense amplifiers.

Further, when the address comparator 60, to which the address signal An the address information of which is bypassed is supplied, is also disposed in the inside region, the NOR circuit 65 also must be disposed in the inside region to reduce the parasitic capacitance of the signal output from the address comparator 60. The address signal bypass control signal TEST2 also must be passed through each gap G because it is supplied to the NOR circuit 65 as well as is used by the column decoders, the second sense amplifiers, and the like.

Thus, the disposition of the address signal line in the outside region 54 makes it unnecessary to pass the wires for the address signal and the control signal TEST2 through each gap G, which can further provide the fuse pitches with an allowance.

Further, in FIG. 13, the hit detector 66 is a circuit to which supplied is the signal (the output from the NOR circuit 65) having information whether or not a state of an address fuse of one bit in a fuse set agrees with the address signal An corresponding thereto. Likewise, the partial hit detector 56 is also a circuit to which supplied is a signal having information whether or not the state of the address fuse of one bit agrees with an address signal $A_{n-1}$ corresponding thereto.

The signal output from the address comparator, which determines whether or not the state of the address fuse of one bit in the fuse set agrees with the corresponding address, is a signal that transits each time an address signal changes. Thus, the signals output from the hit detector and the partial hit detector 56 are also signals which transit each time the address signal changes. As a result, it is important in the realization of a high speed redundancy system to reduce parasitic capacitance by shortening the wiring length of the signals output from the hit detector and the partial hit detector.

Accordingly, when the hit detector 66, and the like are disposed in the outside region 54 based on the disposition of the spare CSL activation circuit and the inactivation signal generation circuit in the outside region 54 in FIG. 14, it is possible to reduce parasitic capacitance by shortening the wiring length of the output signal of the hit detector.

When the hit detector 66 and the like are disposed in the outside region 54, the NOR circuit 65 and the EX-NOR circuit 60, which supply the signal having the information whether or not the state of the address fuse of one bit in the fuse set agrees with the corresponding address signal An, are also disposed in the outside region 54.

This is because that the above disposition results in the reduction of the parasitic capacitance by shortening the wiring length of the signal (the output from the NOR circuit 65) having the information whether or not the state of the address fuse of one bit in the fuse set agrees with the corresponding address signal An in view of that the signal transits each time the address input changes. Accordingly, a higher speed redundancy system can be realized.

Incidentally, in the circuit arranged as described above, the wiring length of an input signal FOUTn, which is supplied to the circuit, which supplies the signal having the information whether or not the state of the address fuse of one bit in the fuse set agrees with the corresponding address signal An, is lengthened. However, even if the input signal FOUTn is transmitted via a wiring with a long wiring length and parasitic capacitance is increased thereby, no problem is arisen at all because the input signal FOUTn is fixed at the initialization of the fuses and does not transit thereafter.

Further, the signal line of the signal FOUTn is disposed in each gap between fuses. When the address signal An, which is supplied to the circuit, from which the signal having the information whether or not the state of the address fuse of one bit in the fuse set agrees with the corresponding address signal An is supplied, discriminates the plurality of elements, which are simultaneously activated in a repair region in a certain operation mode, in a different mode, the signal FOUTn must be supplied to the inactivating signal generation circuit 59 disposed in the outside region 54. Thus, the signal line of the signal FOUTn must be disposed in each gap between fuses in any way. As a result, the disposition of the circuit, which supplies the signal having the information whether or not the state of the address fuse of one-bit in the fuse set agrees with the corresponding address signal An, does not increase the number of signal lines which must be passed through each gap G between fuses. Thus, it is possible to provide the fuse pitches with an allowance by reducing the width of each gap G between fuses.

Further, when the address signal An, which is supplied to the circuit, from which the signal having the information whether or not the state of the address fuse of one bit in the fuse set agrees with the corresponding address signal An is supplied, is also necessary in the column decoding used in the column decoders and the second sense amplifiers, the number of the signal lines which must be passed through each gap G between fuses can be reduced by disposing the circuit, from which the signal having the information whether or not the state of the address fuse of one-bit in the fuse set agrees with the corresponding address signal An is supplied, in the outside region 54. This is because that if the circuit is not disposed in the outside region 54, the signal line of the address signal supplied to the circuit is not disposed in the outside region 54. Thus, the signal line must be passed through each gap G between fuses to use the address signal by the column decoders and the second sense amplifiers. Conversely, when the circuit, which supplies the signal having the information whether or not the state of the address fuse of one-bit in the fuse set agrees with the corresponding address signal An, is disposed in the outside region 54, the signal line of the corresponding address signal is also provided in the outside region 54, and thereby it is not necessary to pass the signal line through each gap G between fuses.

Further, when the address signal An, which is supplied to the circuit, which supplies the signal having the information whether or not the state of the address fuse of one-bit in the fuse set agrees with the corresponding address signal An, is bypassed depending upon an operation mode, the disposition of the circuit, which supplies the signal having the information whether or not the state of the address fuse of one-bit in the fuse set agrees with the corresponding address signal An, in the outside region 54 can reduce the number of the lines which must be passed through the gap G between fuses. This is because that the address signal is used by the column decoders and the second sense amplifiers.

Note that while the above embodiments exemplify to relieve a defective cell in the memory array using a column redundant element, the defect can be also relived in the same way even if the row redundant element shown in FIG. 1 is used. Which of the redundant elements is to be used is not particularly limited and can be optionally determined based on the overall layout of a semiconductor memory device.

As described above in detail, according to the respective aspects of the present invention, there can be provided a semiconductor memory device having a redundancy system that has high redundancy efficiency without increasing the area of a redundancy layout.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device having a memory system and a redundancy system including redundant elements for repairing a plurality of defects in the memory system, comprising:
    a plurality of fuse sets each including address fuses for programming a defective address in the memory system; and
    a master fuse for preventing a corresponding redundant element from being selected when the redundant element is not used,
    wherein at least one master fuse is shared by at least two fuse sets among the plurality of fuse sets.

2. A semiconductor memory device according to claim 1, wherein at least two fuse sets, which share a master fuse, are included in a plurality of fuse sets corresponding to a plurality of redundant elements capable of repairing a plurality of defective memory elements of a defect mode in which a plurality of memory elements are simultaneously made defective in the memory system.

3. A semiconductor memory device according to claim 1, wherein at least two fuse sets, which share a master fuse, are included in a plurality of fuse sets corresponding to a plurality of redundant elements capable of repairing a plurality of defective memory elements physically continuous and grouped.

4. A semiconductor memory device according to claim 1, wherein a plurality of repair regions exist in the memory system, and at least two fuse sets, which share a master fuse, are included in a plurality of fuse sets corresponding to a plurality of redundant elements provided for the identical repair region among the plurality of repair regions.

5. A semiconductor memory device according to claim 1, wherein the redundancy system has spare column selection lines and a column redundancy system setting column redundancy repair regions by row addresses, and at least two fuse sets, which share a master fuse, are included in a plurality of fuse sets corresponding to a plurality of redundant elements which belong to the identical spare column selection line.

6. A semiconductor memory device according to claim 1, wherein the redundancy system has a column redundancy system setting column redundancy repair regions by the row addresses, and the repair regions are set so as to divide bit lines, at least two fuse sets, which share a master fuse, are included in a plurality of fuse sets corresponding to a plurality of redundant elements whose repair regions are different from one another and divide the same bit line.

7. A semiconductor memory device according to claim 6, wherein a plurality of redundant elements, which correspond to a plurality of fuse sets sharing the master fuse, belong to the same spare column selection line.

8. A semiconductor memory device according to claim 1, wherein a plurality of fuse sets, which correspond to a plurality of redundant elements capable of substituting for a plurality of defective memory elements which share the same sense amplifier, includes at least two fuse sets which share one master fuse.

9. A semiconductor memory device according to claim 5, wherein a plurality of redundant elements, which correspond to a plurality of fuse sets sharing the master fuse, can relieve a plurality of defective memory elements sharing the same sense amplifier.

10. A semiconductor memory device according to claim 3, wherein the redundancy system comprises a first fuse set, in which a defective address is programmed, and a second fuse set which shares the master fuse with the first fuse set and in which an address physically adjacent to the defective address is programmed.

11. A semiconductor memory device according to claim 4, wherein the redundancy system comprises a first fuse set, in which a defective address is programmed, and a second fuse set which shares the master fuse with the first fuse set and in which an address physically adjacent to the defective address is programmed.

12. A semiconductor memory device according to claim 5, wherein the redundancy system has a first fuse set, in which a defective column address is programmed, and a second fuse set which shares the master fuse with the first fuse set and in which the same address as the defective column address is programmed.

13. A semiconductor memory device according to claim 6, wherein the redundancy system has a first fuse set, in which a defective column address is programmed, and a second fuse set which shares the master fuse with the first fuse set and in which the same address as the defective column address is programmed.

14. A semiconductor memory device according to claim 7, wherein the redundancy system has a first fuse set, in which a defective column address is programmed, and a second fuse set which shares the master fuse with the first fuse set and in which the same address as the defective column address is programmed.

15. A semiconductor memory device according to claim 8, wherein the redundancy system has a first fuse set, in which a defective column address is programmed, and a second fuse set which shares the master fuse with the first fuse set and in which the same address as the defective column address is programmed.

16. A semiconductor memory device according to claim 9, wherein the redundancy system has a first fuse set, in which a defective column address is programmed, and a second fuse set which shares the master fuse with the first fuse set and in which the same address as the defective column address is programmed.

17. A redundancy system for a semiconductor memory device, comprising:
a fuse bank having a plurality of juxtaposed fuses;
fuse latch circuits corresponding to the plurality of fuses, respectively;
a plurality of address signal wirings corresponding to the plurality of address fuses in the fuse bank; and
a plurality of address comparators to which address signals are supplied via the address signal wirings;
wherein at least one of the address signal wirings and the address comparators is disposed in a side opposite to a side where the fuse latch circuits are disposed with respect to the fuse bank.

18. A redundancy system of a semiconductor memory device, comprising:
a first fuse bank having a plurality of juxtaposed fuses;
a second fuse bank disposed in parallel with the first fuse bank and having a plurality of juxtaposed fuses;
a plurality of address signal wirings corresponding to the plurality of address fuses in the first and second fuse banks; and
a plurality of address comparators to which address signals are supplied via the address signal wirings;
wherein at least one of the address signal wirings and the address comparators is disposed in the outside of the row of the first and second juxtaposed fuse banks.

19. A redundancy system of a semiconductor memory device according to claim 17, wherein, as to the address signal wiring or the address comparator which is disposed in a side opposite to the side where the fuse latch circuits are disposed with respect to the fuse bank, a corresponding address signal is a signal that is also necessary for decoding in column decoders or second sense amplifiers.

20. A redundancy system of a semiconductor memory device according to claim 18, wherein, as to the address signal wiring or the address comparator which is disposed in the outside of the row of the first and second fuse banks, a corresponding address signal is a signal that is also necessary for decoding in column decoders or second sense amplifiers.

21. A redundancy system of a semiconductor memory device according to claim 17, wherein, as to the address signal wiring or the address comparator which is disposed in a side opposite to the side where the fuse latch circuits are disposed with respect to the fuse bank, a corresponding address signal is an address signal for discriminating a plurality of memory elements, which are simultaneously activated in a repair region in a certain operation mode, in a different operation mode.

22. A redundancy system of a semiconductor memory device according to claim 18, wherein, as to the address signal wiring or the address comparator which is disposed in the outside of the row of the first and second fuse banks, a corresponding address signal is an address signal for discriminating a plurality of memory elements, which are simultaneously activated in a repair region in a certain operation mode, in a different operation mode.

23. A redundancy system of a semiconductor memory device according to claims 17, wherein, as to the address signal wiring or the address comparator which is disposed in a side opposite to the side where the fuse latch circuits are disposed with respect to the fuse bank, a corresponding address signal is an address signal that is bypassed in a certain operation mode.

24. A redundancy system of a semiconductor memory device according to claim 18, wherein, as to the address signal wiring or the address comparator which is disposed in the outside of the row of the first or second fuse banks, a corresponding address signal is an address signal that is bypassed in a certain operation mode.

25. A redundancy system of a semiconductor device with a memory system, comprising:
a plurality of redundant elements for relieving a defect in the memory system;
a plurality of fuse sets including a plurality of address fuses for programming a defective address in the memory system and corresponding to the redundant elements;
a plurality of control circuits to which a signal having information whether or not a state of an address fuse of one bit in the fuse set agrees with a corresponding address signal is supplied;
a fuse bank in which the plurality of fuse sets are disposed; and
a plurality of fuse latch circuits corresponding to the plurality of fuses, respectively;
wherein at least one of the control circuits is disposed in a side opposite to the side where the fuse latch circuits are disposed with respect to the fuse bank.

26. A redundancy system of a semiconductor device with a memory system, comprising:
a plurality of redundant elements for relieving a defect in the memory system;

a plurality of fuse sets including a plurality of address fuses for programming a defective address in the memory system and corresponding to the redundant elements;

a plurality of control circuits to which a signal having information whether or not a state of an address fuse of one bit in the fuse set agrees with a corresponding address signal is supplied;

a first fuse bank in which the plurality of fuse sets are disposed; and a second fuse bank disposed in parallel with the first fuse bank and having a plurality of fuse sets;

wherein at least one of the control circuits is disposed in the outside of the row of the first and second fuse banks.

27. A semiconductor memory device according to claims 25, wherein the circuit, which supply the signal having the information whether or not the state of the address fuse of one bit in the fuse set agrees with the corresponding address signal, is disposed in the same side of region as that where the control circuit disposed in the side opposite to the side where the fuse latch circuits are disposed with respect to the fuse bank is disposed.

28. A semiconductor memory device according to claim 26, wherein the circuit, which supply the signal having the information whether or not the state of the address fuse of one bit in the fuse set agrees with the corresponding address signal, is disposed in the same side of region as that where the control circuit disposed in the outside of the row of the first and second fuse banks is disposed.

29. A semiconductor memory device according to claim 27, wherein an address signal, which is supplied to the circuit for supplying the signal having the information whether or not the state of the address fuse of one bit in the fuse set agrees with the corresponding address signal, is an address signal for discriminating a plurality of memory elements, which are simultaneously activated in a repair region in a certain operation mode, in a different operation mode.

30. A semiconductor memory device according to claim 28, wherein an address signal, which is supplied to the circuit for supplying the signal having the information whether or not the state of the address fuse of one bit in the fuse set agrees with the corresponding address signal, is an address signal for discriminating a plurality of memory elements, which are simultaneously activated in a repair region in a certain operation mode, in a different operation mode.

31. A semiconductor memory device according to claim 27, wherein an address signal, which is supplied to the circuit for supplying the signal having the information whether or not the state of the address fuse of one bit in the fuse set agrees with the corresponding address signal is a signal that is also necessary for decoding in column decoders or second sense amplifiers.

32. A semiconductor memory device according to claim 28, wherein an address signal, which is supplied to the circuit for supplying the signal having the information whether or not the state of the address fuse of one bit in the fuse set agrees with the corresponding address signal, is a signal that is also necessary for decoding in column decoders or second sense amplifiers.

33. A semiconductor memory device according to claim 27, wherein an address signal, which is supplied to the circuit for supplying the signal having information whether or not the state of the address fuse of one bit in the fuse set agrees with the corresponding address signal, is an address signal that is bypassed in a certain operation mode.

34. A semiconductor memory device according to claim 28, wherein an address signal, which is supplied to the circuit for supplying the signal having information whether or not the state of the address fuse of one bit in the fuse set agrees with the corresponding address signal, is an address signal that is bypassed in a certain operation mode.

* * * * *